United States Patent
Yamazaki et al.

(10) Patent No.: US 11,844,260 B2
(45) Date of Patent: Dec. 12, 2023

(54) DISPLAY DEVICE COMPRISING THIN GLASS LAYER

(71) Applicant: Semiconductor Energy Laboratory Co., Ltd., Kanagawa-ken (JP)

(72) Inventors: Shunpei Yamazaki, Tokyo (JP); Yoshiharu Hirakata, Kanagawa (JP); Kensuke Yoshizumi, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 409 days.

(21) Appl. No.: 17/136,663

(22) Filed: Dec. 29, 2020

(65) Prior Publication Data

US 2021/0151515 A1    May 20, 2021

Related U.S. Application Data

(63) Continuation of application No. 16/902,811, filed on Jun. 16, 2020, now Pat. No. 11,088,222, which is a
(Continued)

(30) Foreign Application Priority Data

Jul. 12, 2012 (JP) .................................. 2012-156357

(51) Int. Cl.
*H10K 59/40* (2023.01)
*G06F 3/041* (2006.01)
(Continued)

(52) U.S. Cl.
CPC ......... *H10K 59/40* (2023.02); *G02F 1/13338* (2013.01); *G06F 3/044* (2013.01);
(Continued)

(58) Field of Classification Search
CPC .... H10K 59/38; H10K 50/8426; H10K 59/12; H10K 2102/311; H10K 2102/351;
(Continued)

(56) References Cited

U.S. PATENT DOCUMENTS 5,834,327 A    11/1998 Yamazaki et al.
6,781,152 B2    8/2004 Yamazaki
(Continued)

FOREIGN PATENT DOCUMENTS

CN    001898712 A    1/2007
CN    101082713 A    12/2007
(Continued)

OTHER PUBLICATIONS

Wada, N. et al., "Novel Light-Scattering Glass Substrate for the Enhancement of OLED Lighting Out-coupling Efficiency," SID Digest '12: SID International Symposium Digest of Technical Papers, Jun. 3, 2012, pp. 922-924.
(Continued)

*Primary Examiner* — Jami Valentine Miller
(74) *Attorney, Agent, or Firm* — Husch Blackwell LLP

(57) ABSTRACT

The thickness of a display device including a touch sensor is reduced. Alternatively, the thickness of a display device having high display quality is reduced. Alternatively, a method for manufacturing a display device with high mass productivity is provided. Alternatively, a display device having high reliability is provided. Stacked substrates in each of which a sufficiently thin substrate and a relatively thick support substrate are stacked are used as substrates. One surface of the thin substrate of one of the stacked substrates is provided with a layer including a touch sensor, and one surface of the thin substrate of the other stacked substrate is provided with a layer including a display element. After the two stacked substrates are attached to each
(Continued)

other so that the touch sensor and the display element face each other, the support substrate and the thin substrate of each stacked substrate are separated from each other.

20 Claims, 9 Drawing Sheets

Related U.S. Application Data continuation of application No. 16/686,556, filed on Nov. 18, 2019, now Pat. No. 10,818,737, which is a continuation of application No. 16/036,360, filed on Jul. 16, 2018, now Pat. No. 10,516,007, which is a continuation of application No. 15/222,563, filed on Jul. 28, 2016, now Pat. No. 10,032,833, which is a continuation of application No. 14/794,197, filed on Jul. 8, 2015, now Pat. No. 9,406,725, which is a continuation of application No. 13/938,532, filed on Jul. 10, 2013, now Pat. No. 9,082,678.

(51) Int. Cl.
| | | |
|---|---|---|
| H01L 29/786 | (2006.01) | |
| G06F 3/044 | (2006.01) | |
| H10K 50/842 | (2023.01) | |
| H10K 59/12 | (2023.01) | |
| H10K 59/38 | (2023.01) | |
| H10K 59/60 | (2023.01) | |
| H10K 71/80 | (2023.01) | |
| H01L 21/82 | (2006.01) | |
| H01L 27/15 | (2006.01) | |
| G02F 1/1333 | (2006.01) | |
| H01L 21/683 | (2006.01) | |
| H01L 27/12 | (2006.01) | |
| G02F 1/136 | (2006.01) | |
| H10K 102/00 | (2023.01) | |
| G02F 1/1368 | (2006.01) | |

(52) U.S. Cl.
CPC .......... *G06F 3/0412* (2013.01); *G06F 3/0445* (2019.05); *H01L 21/6835* (2013.01); *H01L 21/82* (2013.01); *H01L 27/1218* (2013.01); *H01L 27/15* (2013.01); *H01L 29/7869* (2013.01); *H10K 50/8426* (2023.02); *H10K 59/12* (2023.02); *H10K 59/38* (2023.02); *H10K 59/60* (2023.02); *H10K 71/80* (2023.02); *G02F 1/1368* (2013.01); *G02F 1/13606* (2021.01); *G02F 1/133325* (2021.01); *G02F 2202/28* (2013.01); *G06F 2203/04103* (2013.01); *H01L 27/1225* (2013.01); *H01L 2221/68363* (2013.01); *H01L 2221/68386* (2013.01); *H10K 2102/311* (2023.02); *H10K 2102/351* (2023.02)

(58) Field of Classification Search
CPC ............... G02F 1/1368; H01L 27/1225; H01L 21/6835; H01L 29/7869
USPC .......................................................... 257/43
See application file for complete search history.

(56) References Cited

U.S. PATENT DOCUMENTS

| | | |
|---|---|---|
| 7,037,752 B2 | 5/2006 | Kuwabara et al. |
| 7,045,438 B2 | 5/2006 | Yamazaki et al. |
| 7,067,392 B2 | 6/2006 | Yamazaki et al. |
| 7,084,045 B2 | 8/2006 | Takayama et al. |
| 7,091,070 B2 | 8/2006 | Imai et al. |
| 7,112,514 B2 | 9/2006 | Yasukawa |
| 7,180,197 B2 | 2/2007 | Nishi et al. |
| 7,245,331 B2 | 7/2007 | Yamazaki et al. |
| 7,307,006 B2 | 12/2007 | Okazaki et al. |
| 7,335,573 B2 | 2/2008 | Takayama et al. |
| 7,399,991 B2 | 7/2008 | Seo et al. |
| 7,466,390 B2 | 12/2008 | French et al. |
| 7,483,091 B1 | 1/2009 | Yamazaki et al. |
| 7,514,868 B2 | 4/2009 | Yamazaki et al. |
| 7,663,149 B2 | 2/2010 | Seo et al. |
| 7,666,050 B2 | 2/2010 | Yamashita et al. |
| 7,691,686 B2 | 4/2010 | Nishi et al. |
| 7,714,950 B2 | 5/2010 | Yamazaki et al. |
| 7,727,809 B2 | 6/2010 | Ito et al. |
| 7,727,859 B2 | 6/2010 | Watanabe et al. |
| 7,868,545 B2 | 1/2011 | Hioki et al. |
| 7,924,350 B2 | 4/2011 | Ma et al. |
| 7,936,338 B2 | 5/2011 | Iwase |
| 8,077,278 B2 | 12/2011 | Miyazaki et al. |
| 8,119,490 B2 | 2/2012 | Ohnuma et al. |
| 8,228,454 B2 | 7/2012 | Yamazaki et al. |
| 8,288,245 B2 | 10/2012 | Ohnuma et al. |
| 8,354,962 B2 | 1/2013 | Aoki |
| 8,404,563 B2 | 3/2013 | Hanaoka |
| 8,427,420 B2 | 4/2013 | Yamazaki et al. |
| 8,432,021 B2 | 4/2013 | Moriwaka |
| 8,508,682 B2 | 8/2013 | Yamazaki et al. |
| 8,808,477 B2 | 8/2014 | Iwase |
| 8,830,413 B2 | 9/2014 | Yamazaki et al. |
| 8,884,868 B2 | 11/2014 | Sakamoto |
| 9,013,650 B2 | 4/2015 | Yamazaki et al. |
| 9,047,799 B2 | 6/2015 | Yamazaki et al. |
| 9,299,879 B2 | 3/2016 | Yamazaki et al. |
| 9,361,853 B2 | 6/2016 | Yamazaki et al. |
| 9,996,115 B2 | 6/2018 | Yamazaki et al. |
| 10,915,145 B2 | 2/2021 | Yamazaki et al. |
| 2001/0055085 A1* | 12/2001 | Jinno ..................... G02F 1/1345 |
| | | 349/139 |
| 2003/0082889 A1 | 5/2003 | Maruyama et al. |
| 2004/0185604 A1 | 9/2004 | Park et al. |
| 2005/0001201 A1 | 1/2005 | Bocko et al. |
| 2005/0007540 A1 | 1/2005 | Tsuboi et al. |
| 2006/0187213 A1 | 8/2006 | Su |
| 2006/0207967 A1 | 9/2006 | Bocko et al. |
| 2006/0250559 A1 | 11/2006 | Bocko et al. |
| 2008/0099664 A1 | 5/2008 | Yamazaki et al. |
| 2008/0100590 A1 | 5/2008 | Hur et al. |
| 2008/0135175 A1 | 6/2008 | Higuchi |
| 2008/0171484 A1 | 7/2008 | Yamashita et al. |
| 2008/0225216 A1* | 9/2008 | Shimodaira ........... G02F 1/1362 |
| | | 349/143 |
| 2008/0237612 A1 | 10/2008 | Cok |
| 2009/0096760 A1 | 4/2009 | Ma et al. |
| 2010/0001639 A1 | 1/2010 | Kim et al. |
| 2010/0026659 A1 | 2/2010 | Long et al. |
| 2010/0108409 A1 | 5/2010 | Tanaka et al. |
| 2010/0148163 A1 | 6/2010 | Im et al. |
| 2010/0163880 A1* | 7/2010 | Jeon ....................... H01L 27/124 |
| | | 438/149 |
| 2010/0188354 A1 | 7/2010 | Tamura |
| 2010/0265187 A1 | 10/2010 | Chang et al. |
| 2010/0321311 A1 | 12/2010 | Chang et al. |
| 2011/0075059 A1 | 3/2011 | Shih et al. |
| 2011/0163979 A1 | 7/2011 | Kim et al. |
| 2011/0255034 A1 | 10/2011 | Nakano. et al. |
| 2011/0273397 A1 | 11/2011 | Hanari |
| 2011/0316810 A1 | 12/2011 | Tsujino et al. |
| 2011/0318881 A1 | 12/2011 | Chida et al. |
| 2012/0086655 A1 | 4/2012 | Wang et al. |
| 2012/0104938 A1 | 5/2012 | Chu et al. |
| 2012/0156457 A1 | 6/2012 | Kondo |
| 2012/0156480 A1 | 6/2012 | Kondo et al. |
| 2012/0202010 A1 | 8/2012 | Uchida |
| 2013/0169587 A1 | 7/2013 | Kim et al. |
| 2014/0008668 A1 | 1/2014 | Hirakata |
| 2014/0285738 A1 | 9/2014 | Iwase |
| 2015/0060817 A1 | 3/2015 | Sato. et al. |
| 2015/0085211 A1 | 3/2015 | Iwase |

(56) References Cited

U.S. PATENT DOCUMENTS

| | | | |
|---|---|---|---|
| 2015/0115271 A1* | 4/2015 | Yoon | ................... H01L 27/0255 257/72 |
| 2017/0168333 A1 | 6/2017 | Kubota et al. | |
| 2017/0317158 A1* | 11/2017 | Choi | ................... H10K 59/123 |
| 2017/0358605 A1* | 12/2017 | Choi | ................... H01L 27/124 |
| 2021/0149449 A1 | 5/2021 | Yamazaki et al. | |

FOREIGN PATENT DOCUMENTS

| | | |
|---|---|---|
| EP | 2 187 294 A1 | 5/2010 |
| EP | 2 452 814 A1 | 5/2012 |
| JP | 2002-324673 A | 11/2002 |
| JP | 2004-145878 A | 5/2004 |
| JP | 2005-182000 A | 7/2005 |
| JP | 2007-512568 | 5/2007 |
| JP | 2008-026710 A | 2/2008 |
| JP | 2009-098629 A | 5/2009 |
| JP | 2009-186916 A | 8/2009 |
| JP | 2009-230072 A | 10/2009 |
| JP | 2009-283676 A | 12/2009 |
| JP | 2010-044337 A | 2/2010 |
| JP | 2010-177601 A | 8/2010 |
| JP | 2010-181747 A | 8/2010 |
| JP | 2010-205222 A | 9/2010 |
| JP | 2010-243930 A | 10/2010 |
| JP | 2010-282181 A | 12/2010 |
| JP | 2011-039406 A | 2/2011 |
| JP | 2011-070092 A | 4/2011 |
| JP | 2011-118082 A | 6/2011 |
| JP | 2011-227205 A | 11/2011 |
| JP | 2011-237489 A | 11/2011 |
| JP | 2012-027177 A | 2/2012 |
| JP | 2012-099450 A | 5/2012 |
| KR | 2006-0107830 A | 10/2006 |
| TW | 200515076 | 5/2005 |
| TW | 200630851 | 9/2006 |
| TW | 201211660 | 3/2012 |
| TW | 201215947 | 4/2012 |
| TW | 201220923 | 5/2012 |
| TW | M429143 | 5/2012 |
| TW | 201227052 | 7/2012 |
| WO | WO 2005/010596 A2 | 2/2005 |
| WO | WO 2005/050754 A1 | 6/2005 |
| WO | WO 2005/052892 A1 | 6/2005 |
| WO | WO 2007/127191 A2 | 11/2007 |
| WO | WO 2010/079688 A1 | 7/2010 |
| WO | WO 2010/095189 A1 | 8/2010 |
| WO | WO 2010/128616 A1 | 11/2010 |
| WO | WO 2011/048979 A1 | 4/2011 |

OTHER PUBLICATIONS

Taiwanese Office Action re Application No. TW 102124387, dated Jan. 23, 2017.
Taiwanese Office Action re Application No. TW 106124604, dated May 23, 2018.
German Office Action (Application No. 102013213552.1) DATED Aug. 5, 2020.

* cited by examiner

DISPLAY DEVICE COMPRISING THIN GLASS LAYER

This application is a continuation of copending U.S. application Ser. No. 16/902,811, filed on Jun. 16, 2020 which is a continuation of U.S. application Ser. No. 16/686,556, filed on Nov. 18, 2019 (now U.S. Pat. No. 10,818,737 issued Oct. 27, 2020) which is a continuation of U.S. application Ser. No. 16/036,360, filed on Jul. 16, 2018 (now U.S. Pat. No. 10,516,007 issued Dec. 24, 2019) which is a continuation of U.S. application Ser. No. 15/222,563, filed on Jul. 28, 2016 (now U.S. Pat. No. 10,032,833 issued Jul. 24, 2018) which is a continuation of U.S. application Ser. No. 14/794,197, filed on Jul. 8, 2015 (now U.S. Pat. No. 9,406,725 issued Aug. 2, 2016) which is a continuation of U.S. application Ser. No. 13/938,532, filed on Jul. 10, 2013 (now U.S. Pat. No. 9,082,678 issued Jul. 14, 2015) which are all incorporated herein by reference.

BACKGROUND OF THE INVENTION

1. Field of the Invention

One embodiment of the present invention relates to a display device for displaying an image.

2. Description of the Related Art

A variety of portable electronic devices, such as a cell phone, a smartphone, a personal computer, a tablet terminal, a portable game machine, and a portable music player, have recently come into widespread use. More intuitively operable electronic devices can be obtained by providing a touch sensor over a display portion for image display as an interface of such portable electronic devices.

In the display portion, a light-emitting device including an organic electroluminescent (EL) element, a liquid crystal display device, an electronic paper performing display by an electrophoretic method, or the like can be typically used.

For example, in a basic structure of an organic EL element, a layer containing a light-emitting organic compound is provided between a pair of electrodes. By applying voltage to this element, light emission from the light-emitting organic compound can be obtained. A display device including such an organic EL element needs no backlight which is necessary for liquid crystal display devices and the like; therefore, thin, lightweight, high contrast, and low power consumption display devices can be obtained. For example, Patent Document 1 discloses an example of a display device including an organic EL element.

Typical touch sensors are of resistive type and of capacitive type; besides, a variety of types such as a surface acoustic wave type and an infrared type are known.

REFERENCE

[Patent Document 1] Japanese Published Patent Application No. 2002-324673

SUMMARY OF THE INVENTION

It is desirable that portable electronic devices be lighter, smaller, and thinner for higher portability and convenience. This requires that each component of electronic devices be thinner and smaller. One example of components of electronic devices is a display device.

In the case of a display device in which a touch sensor and a display portion are stacked, it has been difficult to reduce its total thickness sufficiently. Although it is possible to reduce the thickness of the display device by, for example, forming a touch sensor and a display element over respective relatively thick substrates at the time of manufacturing the touch sensor and the display portion and then by polishing the back sides of the substrates, the polishing step after manufacturing the elements causes a decrease in yield. In the case of forming the elements directly over thin substrates, the deflection of the substrates is large, and it is difficult to transport the substrates. In addition, there arise problems such as breakage of the substrates in transporting or processing the substrates.

In some cases, a substrate provided with a color filter is located so as to overlap with a display element to obtain a display device with high display quality. In the case of using a thin substrate as that substrate, there have been problems of difficulty in overlapping the color filter and the display element with high alignment accuracy due to the aforementioned deflection of the substrate or the like, and difficulty in achieving both a high display quality and a small thickness of the display device.

The present invention was made in view of the foregoing technical background. An object is to reduce the thickness of a display device including a touch sensor. Another object is to reduce the thickness of a display device with high display quality. Another object is to provide a method for manufacturing a display device with high mass productivity. Another object is to provide a display device with high reliability.

In order to achieve the above object, a focus is placed on the structure of substrates used to manufacture a touch sensor and a display element. Stacked substrates in each of which a sufficiently thin substrate and a relatively thick support substrate are stacked are used as the substrates. One surface of the thin substrate of one of the stacked substrates is provided with a layer including a touch sensor, and one surface of the thin substrate of the other stacked substrate is provided with a layer including a display element. After the two stacked substrates are attached to each other so that the touch sensor and the display element face each other, the support substrate and the thin substrate of each stacked substrate are separated from each other.

That is, a method for manufacturing a display device in one embodiment of the present invention includes the steps of: attaching a first substrate, which is fixed to a first support substrate and provided with an element layer including a light-emitting element over a surface not facing the first support substrate, and a third substrate, which is fixed to a third support substrate and provided with a color filter layer over a surface not facing the third support substrate, to each other with a first adhesive layer so that the element layer and the color filter layer face each other, and then separating the third substrate and the third support substrate from each other; attaching the third substrate and a second substrate, which is fixed to a second support substrate and provided with a sensor layer over a surface not facing the second support substrate, to each other with a second adhesive layer so that the element layer and the sensor layer face each other, and then separating the second substrate and the second support substrate from each other and separating the first substrate and the first support substrate from each other. In addition, a glass substrate having a thickness of 10 μm to 200 μm is used as each of the first to third substrates, and a base substrate thicker than the glass substrate is used as each of the first to third support substrates.

With the use of such a manufacturing method, a display device including a touch sensor and having a very small total thickness can be manufactured with high yield. In addition, the second substrate provided with the sensor layer and the first substrate provided with a display element can be attached to each other with high alignment accuracy because the two substrates are provided with the respective support substrates.

Furthermore, the three substrates provided with the touch sensor, the display element, and the color filter layer, respectively, are stacked. Accordingly, a display device having a sufficiently small total thickness and a high display quality can be manufactured with high yield. When the third substrate provided with the color filter layer and the first substrate provided with the display element are attached to each other, the substrates are provided with the respective support substrates. Thus, misalignment of color filters and pixels can be suppressed, and the two substrates can be attached to each other with high alignment accuracy. Thus, it is possible to obtain a display device having a very high pixel resolution (e.g., 300 ppi or higher, preferably 400 ppi or higher, and more preferably 500 ppi or higher) and having a very small total thickness.

A method for manufacturing a display device in another embodiment of the present invention includes the steps of: attaching a first substrate, which is fixed to a first support substrate and provided with an element layer including a light-emitting element over a surface not facing the first support substrate, and a third substrate, which is fixed to a third support substrate and provided with a color filter layer over a surface not facing the third support substrate, to each other with a first adhesive layer so that the element layer and the color filter layer face each other, and then separating the third substrate and the third support substrate from each other; attaching the first substrate and a second substrate, which is fixed to a second support substrate and provided with a sensor layer over a surface not facing the second support substrate, to each other with a second adhesive layer so that the color filter layer and the sensor layer face each other, and then separating the second substrate and the second support substrate from each other and separating the first substrate and the first support substrate from each other. In addition, a glass substrate having a thickness of 10 μm to 200 μm is used as each of the first to third substrates, and a base substrate thicker than the glass substrate is used as each of the first to third support substrates.

With the use of such a manufacturing method, a display device provided with a touch sensor on a side opposite to a display side of the display device and having a small total thickness can be manufactured with high yield. Since the touch sensor is provided on the side opposite to the display side, an input operation can be performed without display obscured by a user's finger or the like, which is suitable for an electronic device capable of running game content involving a touch input or playing video content such as a movie.

A method for manufacturing a display device in another embodiment of the present invention includes the steps of: attaching a first substrate, which is fixed to a first support substrate and provided with an element layer including a light-emitting element over a surface not facing the first support substrate, and a second substrate, which is fixed to a second support substrate and provided with a stack of a sensor layer and a color filter layer over a surface not facing the second support substrate, to each other with an adhesive layer so that the element layer and the sensor layer face each other; and separating the first substrate and the first support substrate from each other and separating the second substrate and the second support substrate from each other after attaching the first substrate and the second substrate to each other. In addition, a glass substrate having a thickness of 10 μm to 200 μm is used as each of the first and second substrates, and a base substrate thicker than the glass substrate is used as each of the first and second support substrates.

With the use of such a manufacturing method, a touch sensor and a color filter can be stacked over one substrate; thus, the number of substrates can be reduced and the display device can have a smaller total thickness. When the substrate and a substrate provided with a display element are attached to each other, the substrates are provided with respective support substrates. Accordingly, the two substrates can be attached to each other with high alignment accuracy, and the display device can have a high pixel resolution.

In the above embodiment, it is preferable that the glass substrate be fixed to the base substrate by being in close contact with each other and that an attachment surface of each of the glass substrate and the base substrate has a surface roughness of 2 nm or less.

Alternatively, in the above embodiment, it is preferable that the base substrate be provided with a resin containing an organic compound or a silicon compound and that the glass substrate be fixed to the base substrate by close contact between the resin and the glass substrate.

With the use of such a stacked substrate, the support substrate and the substrate can be prevented from being separated from each other during the steps of manufacturing a display element, a touch sensor, a color filter, and the like, and can be easily separated during the separation step.

A display device in one embodiment of the present invention includes a first substrate, which is provided with an element layer including a light-emitting element, and a second substrate, which is provided with a sensor layer. The first substrate and the second substrate are attached to each other with an adhesive layer so that the element layer and the sensor layer face each other. In addition, each of the first and second substrates is a glass substrate having a thickness of 10 μm to 200 μm. Furthermore, a first conductive film is provided over the first substrate, a second conductive film electrically connected to the sensor layer is provided over the second substrate, and the first conductive film and the second conductive film are electrically connected to each other through a conductive connector.

With such a structure, a display device including a touch sensor can have a very small total thickness. When an external connection electrode connected to an FPC or the like for exchanging signals with the touch sensor is provided on the side of the substrate where a display element is formed, both the external connection electrode for the touch sensor and an external connection electrode for a display portion including the display element can be provided on one surface side of the display device. Thus, the area necessary for connection of the FPC can be reduced. When such a display device is applied to an electronic device, the area occupied by the display device in the electronic device can be reduced and the electronic device can therefore be designed more freely.

In the display device, it is preferable that the second substrate be provided with a color filter layer stacked over the sensor layer.

When the substrate provided with the touch sensor is also provided with the color filter in the above manner, the color filter can be provided with little increase in thickness. Thus, it is possible to obtain a display device having a very small total thickness and a high display quality.

In the above display device, it is preferable that the adhesive layer be provided between the connector and the light-emitting element so as to surround the light-emitting element, and that the first conductive film and the second conductive film be electrically connected to each other outside a region surrounded by the adhesive layer.

When the adhesive layer is provided so as to surround the light-emitting element and a connection portion of the touch sensor is provided in a region outside the adhesive layer in the above manner, impurities in members including the connector provided in the connection portion can be prevented from entering a region where the light-emitting element is provided, whereby the display device can have high reliability.

In any of the above display devices, it is preferable that the adhesive layer contain a glass material.

For the adhesive layer, a material containing a glass material, such as a glass body formed by melting and solidifying powder glass (also called frit glass), is used. Such a material can effectively suppress permeation of moisture and gas and can therefore suppress the deterioration of the light-emitting element. Thus, the display device can have very high reliability.

In any of the above display devices, it is preferable that the element layer include a transistor electrically connected to the light-emitting element, and that an oxide semiconductor be used as a semiconductor where a channel is formed in the transistor.

A transistor formed using an oxide semiconductor is preferable because it can achieve high field-effect mobility with relative ease and can therefore have a smaller size than a transistor formed using amorphous silicon, for example, and increases in aperture ratio and resolution can be achieved. In some cases, an oxide semiconductor may change its electrical characteristics due to an impurity such as moisture. Thus, by providing a transistor inside the adhesive layer or using a material containing a glass material for the adhesive layer as described above, the display device can have higher reliability.

In any of the above display devices, it is preferable that a first connection terminal electrically connected to the element layer and a second connection terminal electrically connected to the first conductive film be provided over the first substrate so as not to overlap with the second substrate, that at least one FPC be electrically connected to each of the first and second connection terminals, and that a reinforcing material be provided in contact with the FPC and the second substrate.

When a region between the FPC and the second substrate is reinforced with the reinforcing material in the above manner, it is possible to prevent even a very thin substrate from being broken in the mechanically relatively weak region in later handling. Thus, the display device can have very high reliability.

Note that in this specification, a display device refers to an image display device provided with a plurality of pixels. In addition, the display device includes all the following modules: a module in which a connector, such as a flexible printed circuit (FPC) or a tape carrier package (TCP), is attached to a display device; a module in which a printed wiring board is provided at the end of a TCP; and a module in which an integrated circuit (IC) is directly mounted by a chip-on-glass (COG) method on a substrate where pixels are formed.

According to the present invention, the thickness of a display device including a touch sensor can be reduced. Alternatively, the thickness of a display device having high display quality can be reduced. Alternatively, a display device can be manufactured with high mass productivity. Alternatively, a display device having high reliability can be provided.

DETAILED DESCRIPTION OF THE INVENTION

Figure 1A:
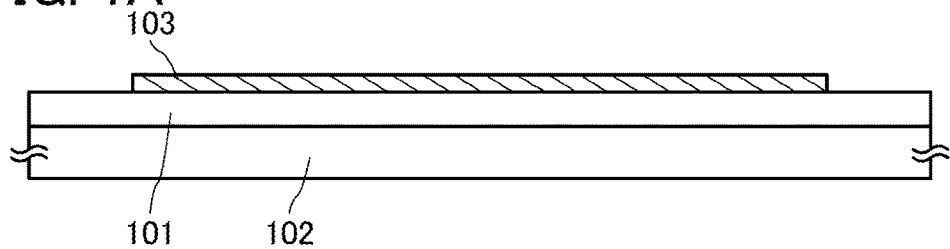
FIGS. 1A to 1E illustrate an example of a method for manufacturing a display device in one embodiment of the present invention.

Embodiments will be described with reference to drawings. Note that the present invention is not limited to the following description, and it is easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

Note that in each drawing described in this specification, the size, the layer thickness, or the region of each component is exaggerated for clarity in some cases. Therefore, embodiments of the present invention are not necessarily limited to such scales.

Note that the term "electrically connected" in this specification and the like includes the case where components are connected through an "object having any electric function". There is no particular limitation on an object having any electric function as long as electric signals can be transmitted and received between components that are connected through the object. Examples of an "object having any electric function" are a switching element such as a transistor, a resistor, a coil, a capacitor, and elements with a variety of functions as well as an electrode and a wiring.

Embodiment 1

In this embodiment, a configuration example of a display device in one embodiment of the present invention and an example of a manufacturing method thereof will be described with reference to drawings.

Manufacturing Method Example 1

First, a stacked substrate in which a first substrate 101 is stacked over a first support substrate 102 is prepared.

As the first substrate 101, a substrate having an insulating surface and having a thickness of 10 µm to 200 µm is used. As a material of the first substrate 101, a glass material, an organic resin material, a conductive material containing a metal or an alloy, or the like can be used.

It is preferable to use a glass material for the first substrate 101. With the glass material, a large-sized substrate having an extremely flat surface and a uniform thickness can be manufactured with relative ease. Such a glass substrate can be manufactured using a float method, an overflow method, or the like.

In the case where the first substrate 101 is on a display surface side, a light-transmitting substrate is used. On the other hand, in the case where the first substrate 101 is on a side opposite to the display surface, a non-light-transmitting substrate may be used. Since conductive materials generally have high thermal conductivity, when a conductive substrate is used as the first substrate, for example, it is possible to promote dissipation of heat generated when an element in an element layer 103 which is described later is driven. In the case of using a conductive substrate, a surface where the element layer 103 is to be formed is preferably subjected to insulating treatment.

As the first support substrate 102, a base substrate which is thicker than at least the first substrate 101 is used. The thickness of the first support substrate 102 is preferably determined in consideration of the thickness of the first substrate 101 so that the substrate can be transported easily at the time of manufacturing the element layer 103 which is described later. For example, the total thickness of a stack of the first support substrate 102 and the first substrate 101 may be set substantially equal to the thickness of a substrate which can be processed in an existing apparatus line (or production line or manufacturing line). Specifically, the thickness of the support substrate is set such that the total thickness of the first support substrate 102 and the first substrate 101 (also an adhesive when used) is larger than 0.4 mm and less than or equal to 2.0 mm, preferably larger than or equal to 0.5 mm and less than or equal to 1.0 mm.

As a material of the first support substrate 102, a glass material, an organic resin material, a conductive material containing a metal or an alloy, or the like can be used. A glass material is preferably used. With the use of a glass material, the flatness of an attachment surface for the first substrate 101 can be increased, and the adhesion between these substrates can be increased.

The first support substrate 102 and the first substrate 101 are fixed to each other by being in close contact with each other or by using an adhesive capable of allowing separation. Therefore, unintentional separation can be prevented in the steps of manufacturing the element layer 103, and separation can be caused easily in a later separation step.

In the case where the first support substrate 102 and the first substrate 101 are fixed by being in close contact with each other, the attachment surface of each substrate should have an arithmetic mean surface roughness of 5 nm or less, preferably 2 nm or less. By close contact between two surfaces having such an extremely high flatness, the first support substrate 102 and the first substrate 101 can be fixed to each other.

The first substrate 101 and the first support substrate 102 can be separated from each other by applying physical force in a direction perpendicular to the attachment surfaces. Here, separation can be easily caused when a region having a relatively large surface roughness is provided at an end portion of either of the substrates which serves as a starting point of separation.

In the case where the first support substrate 102 and the first substrate 101 are fixed to each other by using an adhesive capable of allowing separation, a resin containing an organic compound or a silicon compound is preferably used as the adhesive. In the case of using a glass material for the first support substrate 102 and the first substrate 101, it is particularly preferable to use a resin having a siloxane bond.

The first support substrate 102 and the first substrate 101 are fixed to each other in such a manner that a resin diluted with a solvent is applied to the first support substrate 102, the resin is cured by vaporizing the solvent, and then the first substrate 101 is placed in close contact with and pressed against the resin. The first support substrate 102 and the first substrate 101 can be easily separated from each other by applying force in a direction perpendicular to the attachment surfaces. By forming the resin on the first support substrate 102 side in the above-described manner, the resin can be prevented from remaining on the first substrate 101 after the separation.

In this embodiment, glass substrates are used as the first support substrate 102 and the first substrate 101.

Next, the element layer 103 is formed over a surface of the first substrate 101 on a side opposite to the first support substrate 102 (FIG. 1A).

The element layer 103 includes a plurality of pixels each including at least a display element. In the case of an active-matrix display device, the pixels may each include a transistor and a capacitor. The element layer 103 may also be provided with a driver circuit for driving the pixels (such as a gate driver circuit or a source driver circuit). The element layer 103 further includes a wiring and an electrode.

As the display element, an organic EL element, a liquid crystal element, a display element employing an electrophoretic method, or the like can be used.

The element layer 103 can be manufactured by a variety of manufacturing methods. For example, in the case of an active-matrix display device including an organic EL element, a gate electrode (and a wiring), a gate insulating layer, a semiconductor layer, and a source electrode and a drain electrode (and wirings) which form a transistor are provided over the first substrate 101, and a light-emitting element electrically connected to the transistor is formed thereover with an insulating layer provided therebetween, by stacking a first electrode, a layer containing a light-emitting organic compound, and a second electrode in this order.

Then, a stacked substrate in which a second substrate 111 is fixed onto a second support substrate 112 is prepared. Here, as the stacked substrate, the one that is similar to that described above can be used.

Figure 1B:
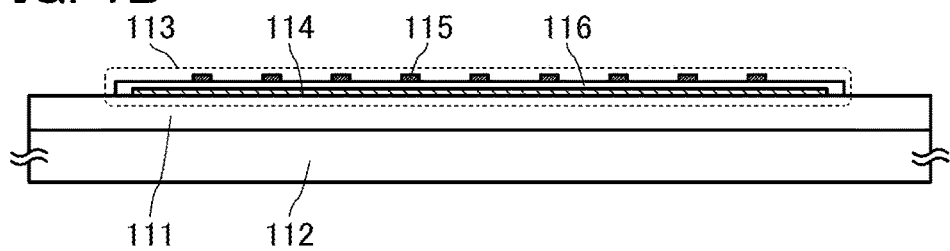

Next, a sensor layer 113 is formed over a surface of the second substrate 111 on a side opposite to the second support substrate 112 (FIG. 1B). Here, the case of using a projected capacitive touch sensor as a sensor element in the sensor layer 113 will be described.

The sensor layer 113 includes a first sensor electrode 114, a second sensor electrode 115, and an insulating layer 116 which insulates the first sensor electrode 114 and the second sensor electrode 115 from each other. The first sensor electrode 114 is provided in the form of stripes in one direction. The second sensor electrode 115 is provided in the form of stripes intersecting the first sensor electrode 114. The first sensor electrode 114 and the second sensor electrode 115 do not necessarily intersect orthogonally and may form an angle of less than 90°.

The insulating layer 116 is provided so as to be sandwiched between the first sensor electrode 114 and the second sensor electrode 115 in order to insulate the two electrodes from each other. FIG. 1B illustrates a structure in which the insulating layer 116 is provided so as to cover the first sensor electrode 114, but the insulating layer 116 may be provided only in portions where the first sensor electrode 114 and the second sensor electrode 115 intersect each other.

In the case where the sensor layer 113 is provided on a display surface side, a light-transmitting conductive material is preferably used for the first sensor electrode 114 and the second sensor electrode 115. In addition, a light-transmitting insulating material is preferably used for the insulating layer 116.

Note that there is no limitation on the order of formation of the element layer 103 and the sensor layer 113, which may be formed separately.

Figure 1C:
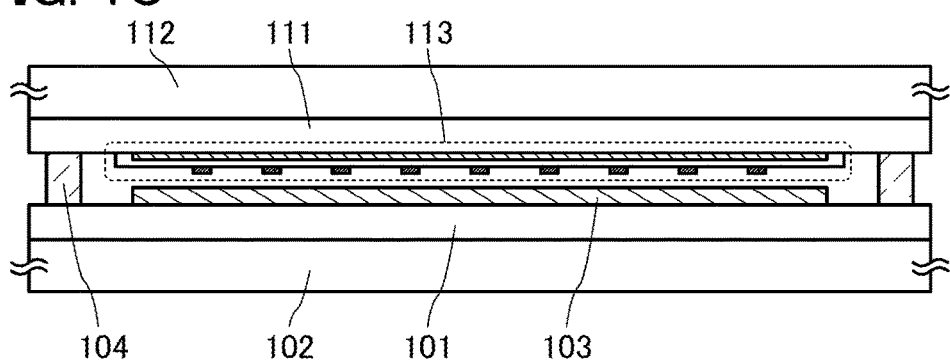

Next, the stacked substrate of the first support substrate 102 and the first substrate 101 and the stacked substrate of the second support substrate 112 and the second substrate 111 are arranged so that the element layer 103 and the sensor layer 113 face each other, and the first substrate 101 and the second substrate 111 are attached to each other with an adhesive layer 104 (FIG. 1C).

For the adhesive layer 104, a curable resin such as a heat curable resin, a photocurable resin, or a two-component type curable resin can be used. The resin is applied to the first substrate 101 or the second substrate 111, and the resin is cured in a state where the first substrate 101 and the second substrate 111 are in close contact with the resin, whereby the two substrates can be attached to each other.

For the adhesive layer 104, a glass material of low-melting-point glass can also be used. In that case, paste containing glass powder (also called a frit material) and a binder is applied to the first substrate 101 or the second substrate 111, and the paste is subjected to heat treatment so that the binder is removed and the fused frit material forms a glass layer. After that, the glass layer is melted by laser irradiation or the like and then solidified in a state where the glass layer and the other substrate are in close contact with each other, whereby the first substrate 101 and the second substrate 111 can be attached to each other with the glass layer (also called a glass body). In the case of using an organic EL element as the display element, it is particularly preferable to use such a glass material which does not easily allow the passage of impurities such as moisture.

Figure 1D:
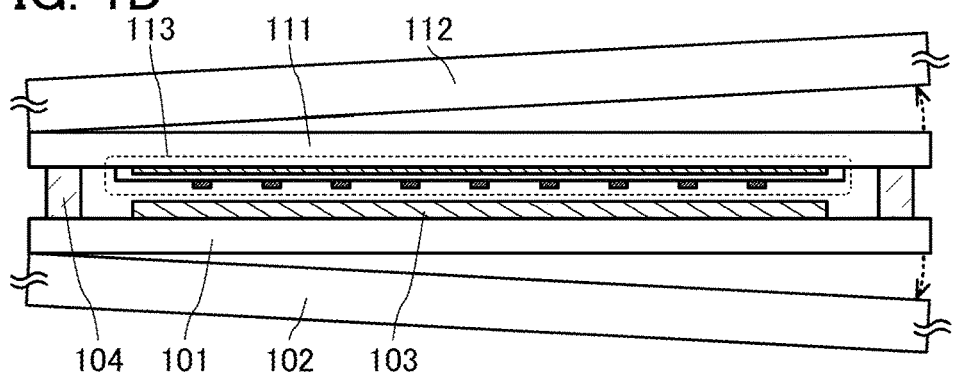

After the first substrate 101 and the second substrate 111 are attached to each other, the first support substrate 102 and the second support substrate 112 are each separated (FIG. 1D).

Here, the case where the second support substrate 112 is separated after the first support substrate 102 is separated will be described.

First, a surface of the second support substrate 112 on a side not provided with the second substrate 111 is fixed to a suction stage or the like. Next, a starting point of separation is formed between the first support substrate 102 and the first substrate 101. For example, the starting point of separation may be formed by inserting a sharp instrument such as a knife into the boundary between the two substrates at an end portion of the first support substrate 102 or the first substrate 101. Alternatively, the starting point of separation may be formed by dripping a liquid that has low surface tension (such as alcohol or water) onto the end portion so that the liquid penetrates into the boundary between the two substrates.

Then, by applying physical force gradually from the starting point of separation in a direction substantially perpendicular to the attachment surfaces, separation can be easily caused without damage to the first support substrate 102. At this time, for example, separation may be caused by attaching tape or the like to the first support substrate 102 and pulling the tape in the aforementioned direction, or separation may be caused by pulling an end portion of the first support substrate 102 with a hook-like member. Alternatively, separation may be caused by attaching a member capable of vacuum suction to the back side of the first support substrate 102.

At the time of separation, static electricity might be generated and the first substrate 101 or the second substrate 111 might be charged therewith. When the first substrate 101 or the second substrate 111 is charged, a circuit or an element in the element layer 103 or the sensor layer 113 might be damaged by electrostatic discharge (ESD). In order to suppress this, separation is preferably caused in a state where a conductive liquid (e.g., an ionic liquid, water including ions such as carbonated water, or the like) is dripped onto the starting point of separation and the liquid is constantly in contact with the separation interface between the first support substrate 102 and the first substrate 101. Alternatively, separation may be caused while the generation of ESD is being suppressed using an ionizer or the like.

Next, the second support substrate 112 is separated. At this time, a surface of the first substrate 101 on a side not provided with the element layer 103 is fixed to a suction stage or the like, and the second support substrate 112 and the second substrate 111 are separated from each other by a method similar to those described above.

Note that here the second support substrate 112 is separated after the first support substrate 102 is separated, but there is no limitation on the order. For example, the first support substrate 102 may be separated after the second support substrate 112 is separated.

Figure 1E:
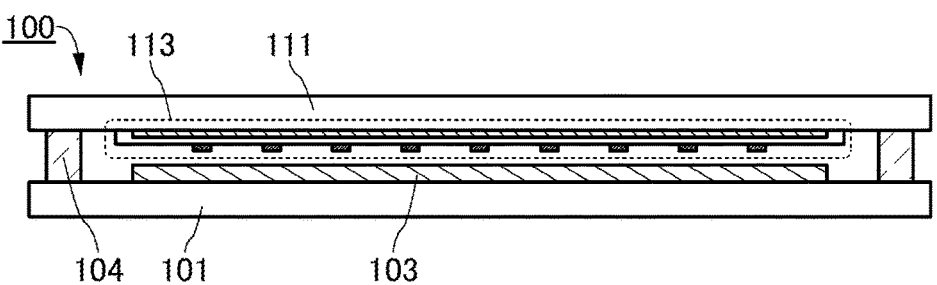

Through the above steps, a display device 100 including a touch sensor and having a very small total thickness can be manufactured with high yield (FIG. 1E).

In the display device 100, the first substrate 101 and the second substrate 111 are attached to each other with the adhesive layer 104, and the element layer 103 formed over the first substrate 101 and including the display element faces the sensor layer 113 formed over the second substrate 111 and including the sensor element. In addition, the first substrate 101 and the second substrate 111 are each characterized by having a very small thickness of 10 μm to 200 μm.

The display device 100 can be formed with the two substrates, the second substrate 111 provided with the touch sensor and the first substrate 101 provided with the display element; thus, the total thickness of the display device 100 can be reduced. In addition, the second substrate 111 and the first substrate 101 can be attached to each other with high alignment accuracy because the two substrates are provided with the respective support substrates during the attachment.

The display device 100 can also have flexibility because of its very small total thickness. Accordingly, an electronic device having a curved display portion, an electronic device whose display portion can be curved, or the like can be obtained.

The above is the description of this manufacturing method example.

Manufacturing Method Example 2

An example of a method for manufacturing a display device different from that in Manufacturing Method Example 1 will be described below. Specifically, a display device including color filters will be described. Note that description of the portions already described in Manufacturing Method Example 1 is omitted or is simplified.

First, as in Manufacturing Method Example 1, the element layer 103 is formed over the first substrate 101 which is fixed to the first support substrate 102. In addition, the sensor layer 113 is formed over the second substrate 111 which is fixed to the second support substrate 112.

Figure 2A:
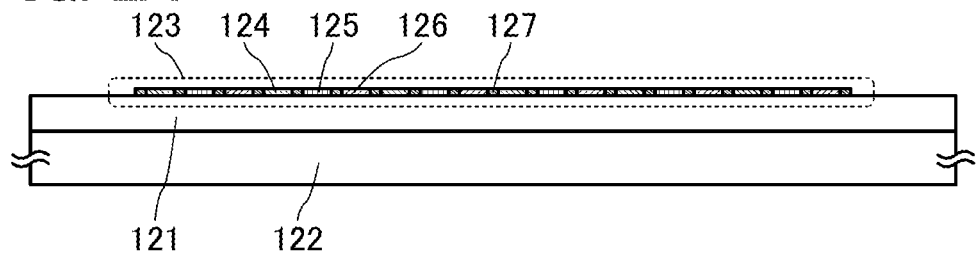
FIGS. 2A to 2D illustrate an example of a method for manufacturing a display device in one embodiment of the present invention.

Then, a color filter layer 123 is formed over a third substrate 121 which is fixed to a third support substrate 122 (FIG. 2A).

The third support substrate 122 can be similar to that of the first support substrate 102, and the third substrate 121 can be similar to that of the first substrate 101.

The color filter layer 123 includes a red color filter 124, a green color filter 125, and a blue color filter 126. The color filters are arranged so as to correspond to the respective pixels included in the element layer 103. Further, a black matrix 127 may be provided between the color filters. An overcoat may be provided so as to cover the color filters and the black matrix 127.

The color filters and the black matrix 127 may be formed using appropriate materials and methods, and are preferably formed using a photolithography method in the case where the pixel resolution is high.

It is preferable that the third substrate 121 be provided with a marker used for alignment at the time of later attachment to the first substrate 101. The marker may be formed at the same time as the color filters and the black matrix 127, or may be formed separately.

Note that there is no limitation on the order of formation of the element layer 103, the sensor layer 113, and the color filter layer 123, which may be formed separately.

Next, the stacked substrate of the first support substrate 102 and the first substrate 101 and the stacked substrate of the third support substrate 122 and the third substrate 121 are arranged so that the element layer 103 and the color filter layer 123 face each other, and the first substrate 101 and the third substrate 121 are attached to each other with the adhesive layer 104.

At this time, the first substrate 101 and the third substrate 121 can be attached while being fixed to the first support substrate 102 and the third support substrate 122, respectively. Thus, the pixels included in the element layer 103 and the color filters of the color filter layer 123 can be aligned with high accuracy. Therefore, even when very thin substrates are used as the first substrate 101 and the third substrate 121, a display device having a high pixel resolution can be obtained.

Figure 2B:
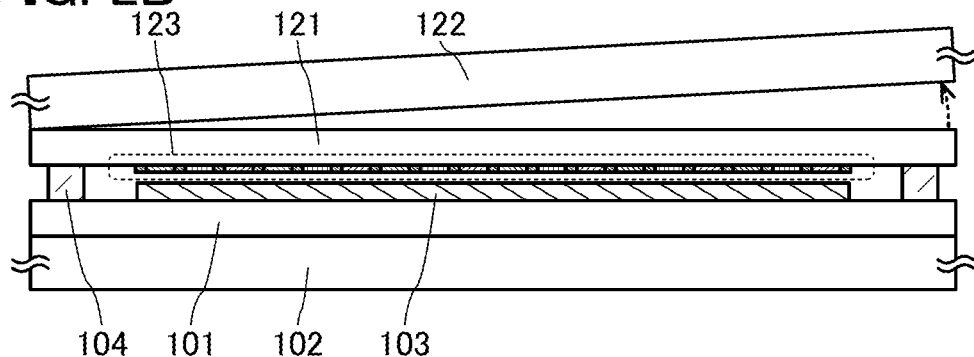

Next, the third support substrate 122 and the third substrate 121 are separated from each other (FIG. 2B). The third support substrate 122 and the third substrate 121 may be separated in a manner similar to that in Manufacturing Method Example 1.

Next, the stacked substrate of the second support substrate 112 and the second substrate 111 provided with the sensor layer 113 is attached to the back side of the third substrate 121 (a side opposite to the side on which the color filter layer 123 is provided) with an adhesive layer 105. In that case, the attachment is performed so that the sensor layer 113 faces the side of the first substrate 101 on which the element layer 103 is formed.

The adhesive layer 105 can be similar to the adhesive layer 104. Alternatively, a double-sided adhesive sheet or the like can be used as the adhesive layer 105. Note that in the case where the adhesive layer 105 is provided so as to overlap with the pixels, a light-transmitting material is used for the adhesive layer 105.

Figure 2C:
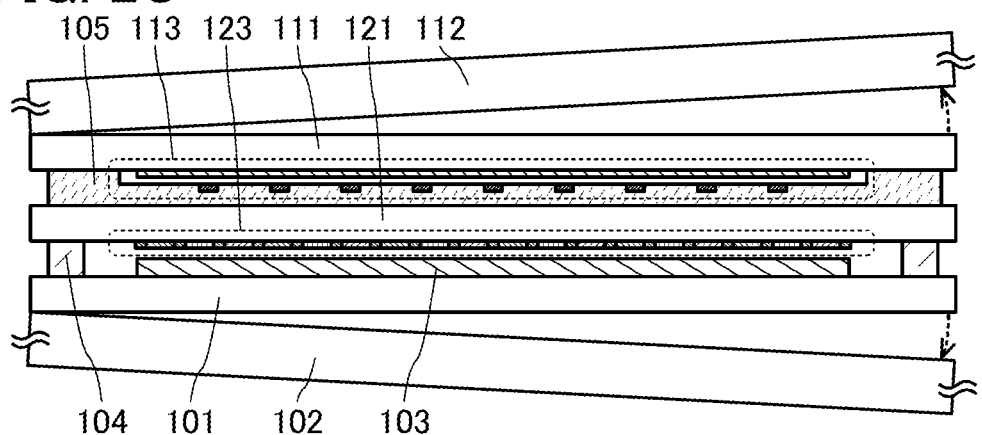

After that, the first substrate 101 and the first support substrate 102 are separated from each other, and the second substrate 111 and the second support substrate 112 are separated from each other (FIG. 2C). These substrates may be separated in manners similar to those in Manufacturing Method Example 1.

Figure 2D:
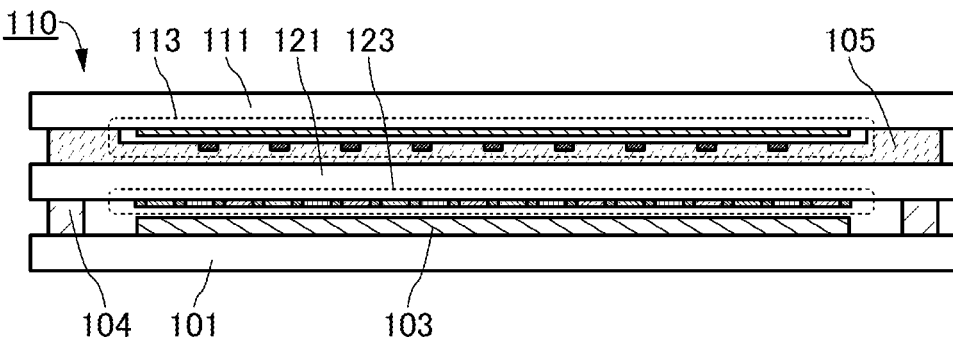

Through the above steps, a display device 110 including a touch sensor and a color filter and having a very small total thickness can be manufactured (FIG. 2D).

In the display device 110, the first substrate 101 and the third substrate 121 are attached to each other with the adhesive layer 104, and the element layer 103 formed over the first substrate 101 and including a display element faces the color filter layer 123 formed over the third substrate 121. In addition, the second substrate 111 provided with the sensor layer 113 and the third substrate 121 are attached to each other with the adhesive layer 105 so that a side of the third substrate 121 on which the color filter layer 123 is not provided faces the sensor layer 113. Furthermore, the first substrate 101, the second substrate 111, and the third substrate 121 are each characterized by having a very small thickness of 10 µm to 200 µm.

The display device 110 having such a structure includes the color filter layer 123, and therefore can have high pixel color purity and can display high-quality images. The touch sensor is provided on the display surface side of the display device 110.

With the use of such a manufacturing method, a display device having a very small total thickness can be manufactured with high yield even when having a structure in which three substrates provided with a touch sensor, a display element, and a color filter, respectively, are stacked. When the third substrate 121 provided with the color filter layer 123 and the first substrate 101 provided with the display element are attached to each other, the substrates are provided with the respective support substrates. Thus, misalignment of color filters and pixels can be suppressed, and the two substrates can be attached to each other with high alignment accuracy. Thus, the display device 110 can have a very high pixel resolution (e.g., 300 ppi or higher, preferably 400 ppi or higher, and more preferably 500 ppi or higher) and have a very small total thickness.

The display device 110 can also have flexibility because of its very small total thickness. Accordingly, an electronic device having a curved display portion, an electronic device whose display portion can be curved, or the like can be obtained.

The above is the description of this manufacturing method example.

Modified Example 1

A method for manufacturing a display device partly different from that in Manufacturing Method Example 2 will be described below. Note that description of the portions already described above is omitted or is simplified.

First, as in Manufacturing Method Example 2, the stacked substrate of the first support substrate 102 and the first substrate 101 and the stacked substrate of the third support substrate 122 and the third substrate 121 are arranged so that the element layer 103 and the color filter layer 123 face each other, and the first substrate 101 and the third substrate 121 are attached to each other with the adhesive layer 104.

Figure 3A:
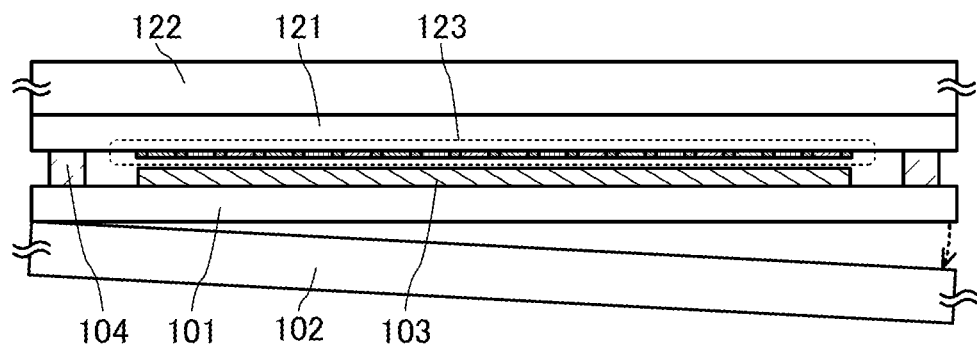
FIGS. 3A to 3C illustrate an example of a method for manufacturing a display device in one embodiment of the present invention.

Next, the first support substrate 102 and the first substrate 101 are separated from each other (FIG. 3A). The first support substrate 102 may be separated in a manner similar to that in Manufacturing Method Example 1.

Next, the stacked substrate of the second support substrate 112 and the second substrate 111 provided with the sensor layer 113 is attached to the back side of the first substrate 101 (a side opposite to the side on which the element layer 103 is not formed) with the adhesive layer 105. In that case, the attachment is performed so that the sensor layer 113 faces the side of the third substrate 121 on which the color filter layer 123 is formed.

For the adhesive layer 105, the material given as an example in Manufacturing Method Example 2 can be used. Since the sensor layer 113 is provided on a side opposite to the display surface side, a material used for the adhesive layer 105 does not necessarily need to have a light-transmitting property even when the adhesive layer 105 is provided so as to overlap with pixels.

Figure 3B:
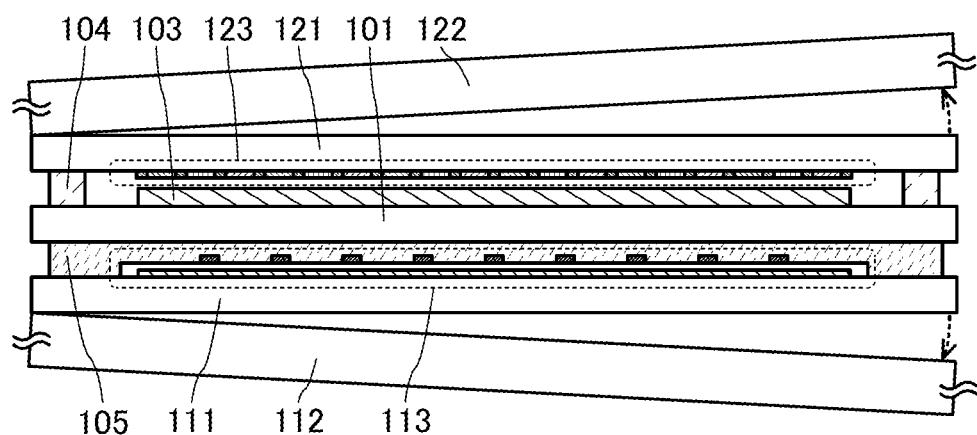

After that, the second support substrate 112 and the second substrate 111 are separated from each other, and the third support substrate 122 and the third substrate 121 are separated from each other (FIG. 3B). These substrates may be separated in manners similar to those in Manufacturing Method Example 1.

Figure 3C:
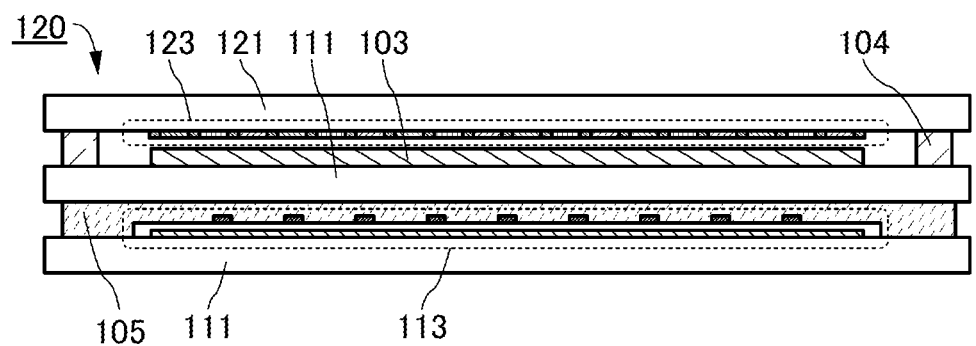

Through the above steps, a display device 120 provided with a touch sensor on a side opposite to the display surface side and having a very small total thickness can be manufactured (FIG. 3C).

In the display device 120, the first substrate 101 and the third substrate 121 are attached to each other with the adhesive layer 104, and the element layer 103 formed over the first substrate 101 and including a display element faces the color filter layer 123 formed over the third substrate 121. In addition, the second substrate 111 provided with the sensor layer 113 and the first substrate 101 are attached to each other with the adhesive layer 105 so that a side of the first substrate 101 on which the element layer 103 is not provided faces the sensor layer 113. Furthermore, the first substrate 101, the second substrate 111, and the third substrate 121 are each characterized by having a very small thickness of 10 μm to 200 μm.

The display device 120 having such a structure includes the color filter layer 123, and therefore can have high pixel color purity and can display high-quality images. The touch sensor is provided on the side opposite to the display surface side of the display device 120. Since the touch sensor is provided on the side opposite to the display surface side, an input operation can be performed without display obscured by a user's finger or the like, which is suitable for an electronic device capable of running game content involving a touch input based on a displayed image or playing video content such as a movie.

The display device 120 can also have flexibility because of its very small total thickness. Accordingly, an electronic device having a curved display portion, an electronic device whose display portion can be curved, or the like can be obtained.

The above is the description of this modified example.

Manufacturing Method Example 3

In this manufacturing method example, an example of a method for manufacturing a display device which is different from the above manufacturing method examples will be described below.

First, as in Manufacturing Method Example 1, the element layer 103 is formed over the first substrate 101 which is fixed to the first support substrate 102.

Figure 4A:
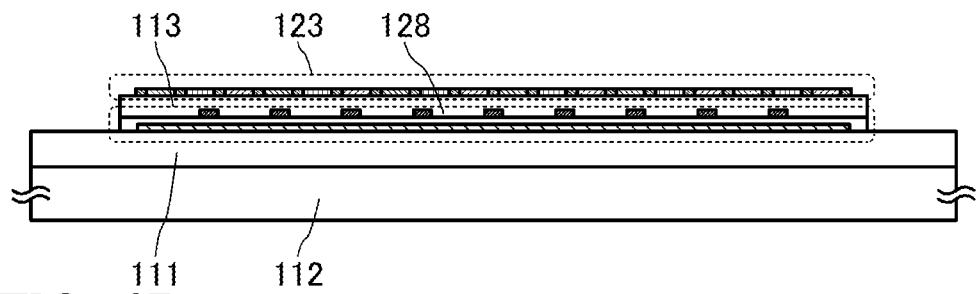
FIGS. 4A to 4D illustrate an example of a method for manufacturing a display device in one embodiment of the present invention.

Then, a stack of the sensor layer 113 and the color filter layer 123 is formed over the second substrate 111 which is fixed to the second support substrate 112 (FIG. 4A).

First, as in Manufacturing Method Example 1, the sensor layer 113 is formed over the second substrate 111 which is fixed to the second support substrate 112.

Next, an insulating layer 128 is formed over the sensor layer 113 so as to cover the second sensor electrode 115.

The insulating layer 128 can be formed by a variety of formation methods using a light-transmitting organic or inorganic insulating material. It is preferable to use an organic resin for the insulating layer 128, in which case the insulating layer 128 can effectively cover steps due to the first sensor electrode 114 and the second sensor electrode 115 of the sensor layer 113 and can have a relatively flat surface, whereby the unevenness of the thickness of color filters which are formed later can be suppressed and the display quality of the display device can be improved.

Then, the color filter layer 123 is formed over the insulating layer 128. The color filter layer 123 can be formed in a manner similar to that in Manufacturing Method Example 2.

Figure 4B:
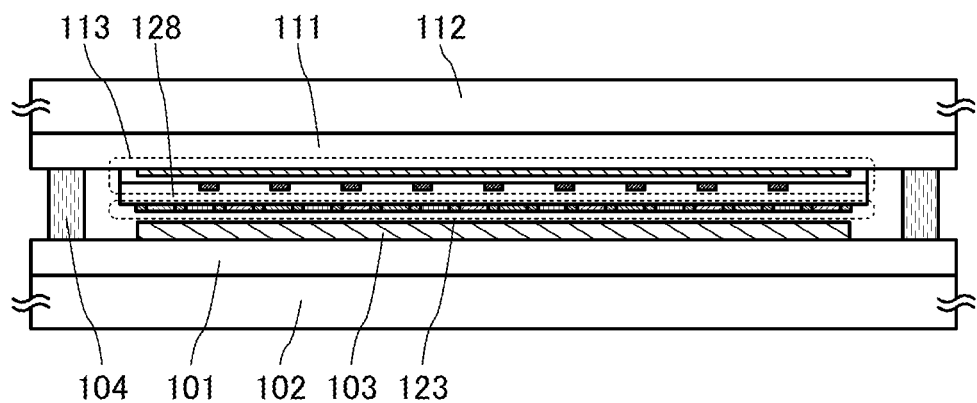

Next, the stacked substrate of the first support substrate 102 and the first substrate 101 and the stacked substrate of the second support substrate 112 and the second substrate 111 are arranged so that the element layer 103 and the color filter layer 123 face each other, and the first substrate 101 and the second substrate 111 are attached to each other with the adhesive layer 104 (FIG. 4B).

At this time, the first substrate 101 and the second substrate 111 can be attached while being fixed to the first support substrate 102 and the second support substrate 112, respectively. Thus, the pixels included in the element layer 103 and the color filters of the color filter layer 123 can be aligned with high accuracy. Therefore, even when very thin substrates are used as the first substrate 101 and the second substrate 111, a display device having a high pixel resolution can be obtained.

Figure 4C:
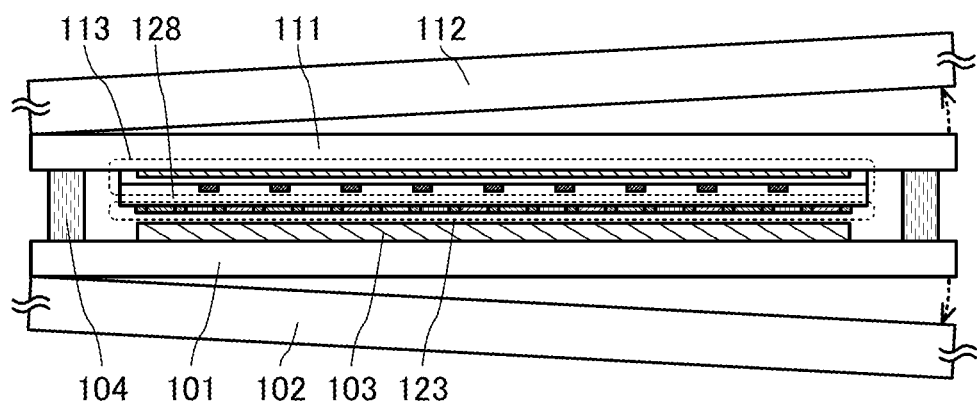

After that, the first substrate 101 and the first support substrate 102 are separated from each other, and the second substrate 111 and the second support substrate 112 are separated from each other (FIG. 4C). These substrates may be separated in manners similar to those in Manufacturing Method Example 1.

Figure 4D:
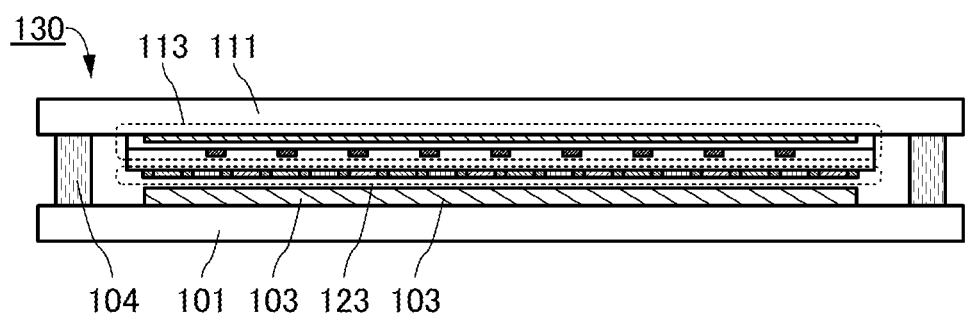

Through the above steps, a display device 130 including a touch sensor and a color filter and having a very small total thickness can be manufactured (FIG. 4D).

In the display device 130, the first substrate 101 and the second substrate 111 are attached to each other with the adhesive layer 104, and the element layer 103 formed over the first substrate 101 and including a display element faces the stack of the sensor layer 113 and the color filter layer 123 formed over the second substrate 111. Furthermore, the first substrate 101 and the second substrate 111 are each characterized by having a very small thickness of 10 μm to 200 μm.

In the display device 130 having such a structure, the sensor layer 113 and the color filter layer 123 are stacked over one substrate; thus, the display device 130 can be formed with two substrates. Accordingly, the display device 130 can have a smaller total thickness. The color filters can be directly formed over the touch sensors, and the two substrates are attached to each other while being fixed to the respective support substrates. Therefore, the touch sensors and the color filters, the touch sensors and the pixels, and the color filters and the pixels can be aligned to each other with high accuracy; thus, a display device having a very high pixel resolution and including highly accurate touch sensors can be obtained.

The display device 130 can also have flexibility because of its very small total thickness. Accordingly, an electronic device having a curved display portion, an electronic device whose display portion can be curved, or the like can be obtained.

The above is the description of this manufacturing method example.

The display devices given as examples in this embodiment each include a touch sensor and have a sufficiently small total thickness. By the methods for manufacturing the display devices given as examples in this embodiment, the display devices having a sufficiently small total thickness can be manufactured with high mass productivity and high yield.

In the methods for manufacturing the display devices given as examples in this embodiment, the steps of forming the element layer, the sensor layer, and the color filter layer over the stacked substrates are also described. Alternatively, a stacked substrate provided with an element layer, a sensor layer, or a color filter layer in advance may be used. Thus, for example, manufacturing a display device using a stacked substrate provided with an element layer in advance and a stacked substrate provided with a sensor layer in advance is also one embodiment of the present invention. In addition, manufacturing a display device using a stacked substrate provided with a color filter layer in advance and a stacked substrate provided with a stack of a sensor layer and a color filter layer in advance is also one embodiment of the present invention.

This embodiment can be implemented in an appropriate combination with any of the other embodiments described in this specification.

Embodiment 2

In this embodiment, a more specific configuration example of a display device which can be manufactured by any of the methods for manufacturing the display devices given as examples in Embodiment 1 will be described. Note that description of the portions already described in Embodiment 1 is omitted or is simplified.

Configuration Example

Figure 5A:
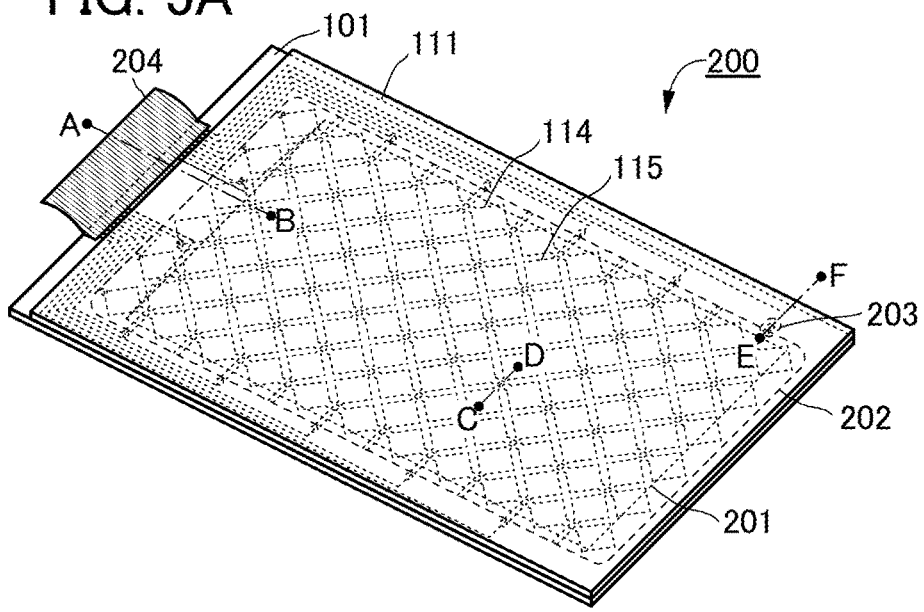
FIGS. 5A and 5B illustrate a configuration example of a display device in one embodiment of the present invention.

FIG. 5A is a schematic perspective view of a display device 200 described in this configuration example. Note that FIGS. 5A and 5B illustrate only major components for simplicity.

The display device 200 includes a display portion 201 and a touch sensor 202 between a first substrate 101 and a second substrate 111. In addition, an FPC 204 is attached to the first substrate 101.

Figure 5B:
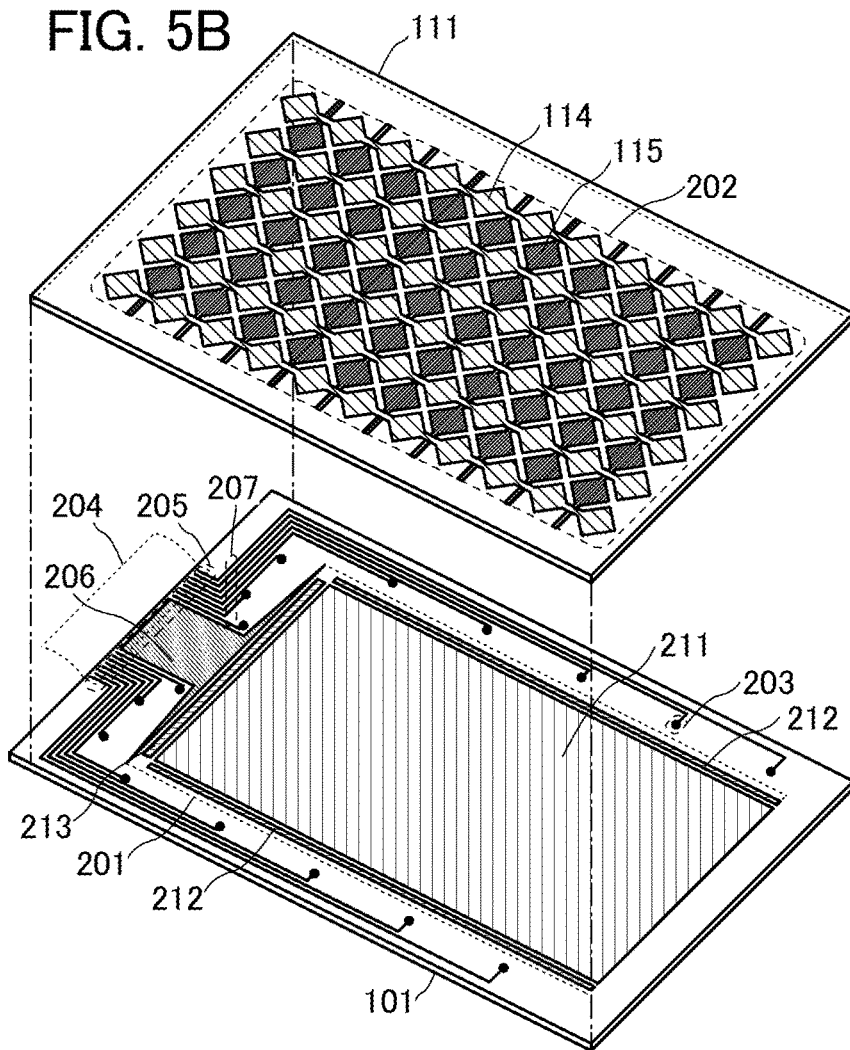

FIG. 5B is a schematic diagram in which the first substrate 101 and the second substrate 111 in FIG. 5A are spaced apart.

The first substrate 101 is provided with the display portion 201, a plurality of wirings 206 electrically connected to the display portion 201, and a plurality of wirings 207 electrically connected to the touch sensor 202 through contact portions 203. The plurality of wirings 206 and the plurality of wirings 207 are led to the periphery of the first substrate 101, and in the periphery, portions of these wirings form part of external connection electrodes 205 for electrical connection to the FPC 204.

The display portion 201 includes a pixel portion 211 including a plurality of pixels, a source driver circuit 212, and a gate driver circuit 213. Although FIG. 5B illustrates a configuration in which two source driver circuits 212 are positioned on both sides of the pixel portion 211, one source driver circuit 212 may be positioned along one side of the pixel portion 211.

As a display element which can be used in the pixel portion 211 of the display portion 201, any of a variety of display elements such as an organic EL element, a liquid crystal element, and a display element performing display by an electrophoretic method or the like can be used.

The second substrate 111 is provided with the touch sensor 202. The touch sensor 202 is provided over a surface of the second substrate 111 on a side facing the first substrate 101. Note that in FIG. 5B, electrodes of the touch sensor 202 which are provided on the back side of the second substrate 111 (the back side of the diagram) are indicated by solid lines for clarity.

The touch sensor 202 illustrated in FIG. 5B is an example of a projected capacitive touch sensor. The touch sensor 202 includes a first sensor electrode 114 and a second sensor electrode 115.

The first sensor electrode 114 and the second sensor electrode 115 are electrically connected to the wirings 207 provided over the first substrate 101 through the contact portions 203. Thus, the touch sensor 202 provided over the second substrate 111 can be driven through the FPC 204 attached to the first substrate 101. Note that a specific configuration example of the contact portions 203 will be described later.

Here, the first sensor electrode 114 and the second sensor electrode 115 are each in the form of a series of quadrangles arranged in one direction as illustrated in FIGS. 5A and 5B. The electrodes are preferably arranged so that the area of crossing portions of the first sensor electrode 114 and the second sensor electrode 115 becomes as small as possible. Such a shape can reduce the area of regions where the electrodes are not provided and decrease luminance unevenness of light passing through the first substrate 111 which may be caused by a difference in transmittance depending on whether the electrodes are provided or not.

Note that the shapes of the first sensor electrode 114 and the second sensor electrode 115 are not limited thereto and can be any of a variety of shapes. For example, a plurality of first sensor electrodes 114 may be arranged so as to have as small a gap as possible, and a plurality of second sensor electrodes 115 thereover may be provided so as to be spaced apart and have regions not overlapping with the first sensor electrodes 114. In that case, between two adjacent second sensor electrodes 115, it is preferable to provide a dummy electrode which is electrically insulated from these electrodes, whereby the area of regions having different transmittances can be reduced.

When external connection electrodes connected to the FPC 204 or the like for exchanging signals with the touch sensor 202 are provided as described above on the side of the first substrate 101 where the display portion 201 is formed, external connection electrodes for both the touch sensor and the display portion 201 can be provided on one surface side of the display device 200. Thus, the area necessary for connection of the FPC 204 can be reduced. Furthermore, when the layout of wirings is devised as illustrated in FIGS. 5A and 5B, only one FPC 204 needs to be provided. When the display device 200 is applied to an electronic device, the area occupied by the display device 200 in the electronic device can be reduced and the electronic device can therefore be designed more freely.

Cross-Sectional Configuration Example 1

A cross-sectional configuration example of the display device 200 in which an organic EL element is included in the display portion 201 will be described below.

Figure 6:
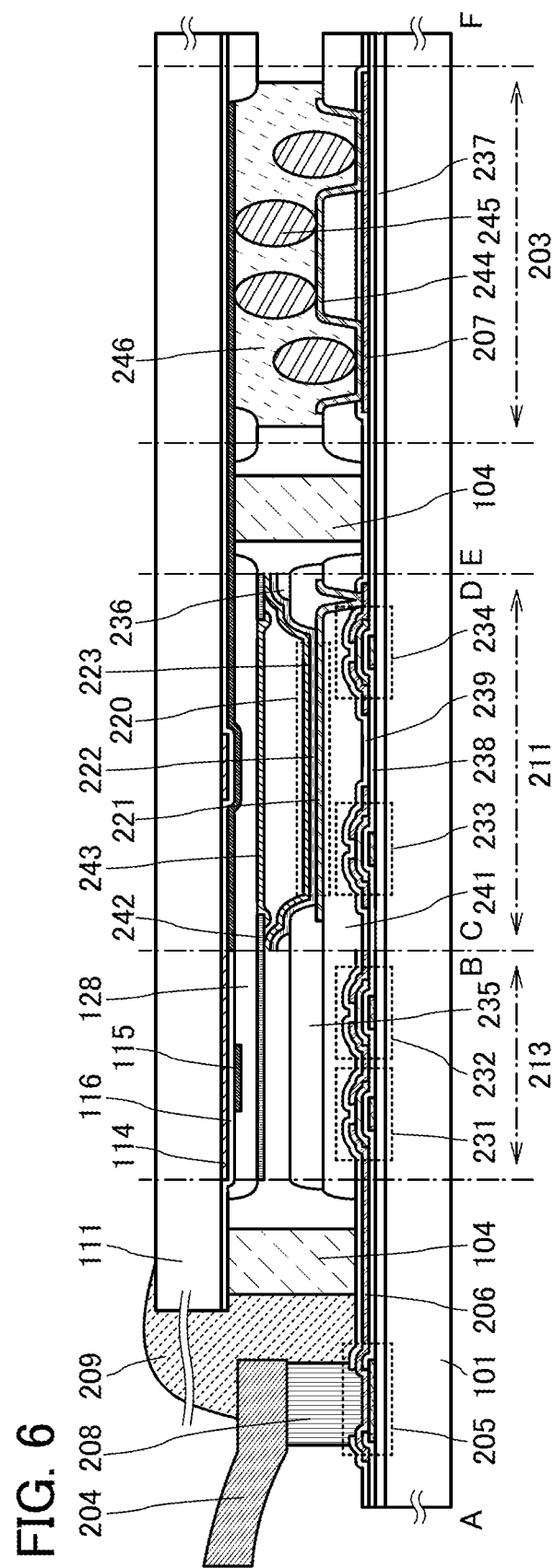
FIG. 6 illustrates a configuration example of a display device in one embodiment of the present invention.

FIG. 6 is a schematic cross-sectional view of a region including the FPC 204 and the gate driver circuit 213 along the section line A-B, a region including the pixel portion 211 along the section line C-D, and a region including the contact portion 203 along the section line E-F, in the display device 200 illustrated in FIG. 5A.

Peripheral portions of the first substrate 101 and the second substrate 111 are attached to each other with the adhesive layer 104. In a region surrounded by the first substrate 101, the second substrate 111, and the adhesive layer 104, at least the pixel portion 211 is provided.

In FIG. 6, the gate driver circuit 213 includes a circuit in which n-channel transistors, transistors 231 and 232, are used in combination, as an example. Note that the gate driver circuit 213 is not limited to this structure and may include various CMOS circuits in which an n-channel transistor and a p-channel transistor are used in combination or a circuit in which p-channel transistors are used in combination. Note that the same applies to the source driver circuit 212. Although a driver-integrated structure in which the gate driver circuit 213 and the source driver circuit 212 are formed over an insulating surface provided with the display portion 201 is described in this configuration example, the gate driver circuit 213 or the source driver circuit 212, or both may be formed over a surface different from the insulating surface provided with the display portion 201. For example, a driver circuit IC may be mounted by a COG method, or a flexible substrate (FPC) mounted with a driver circuit IC by a COF method may be mounted.

FIG. 6 shows a cross-sectional structure of one pixel as an example of the pixel portion 211. The pixel includes a switching transistor 233, a current control transistor 234, and a first electrode layer 221 that is electrically connected to an electrode (a source electrode or a drain electrode) of the transistor 234. An insulating layer 235 is provided so as to cover an end portion of the first electrode layer 221, and a spacer 236 is provided over the insulating layer 235 in a region overlapping with a black matrix 242 which is described later. When a plurality of spacers 236 is provided in the pixel portion 211, the first substrate 101 and the second substrate 111 can be prevented from getting unnecessarily close to each other, and the display device can have high reliability.

The spacer 236 is preferably formed using an organic resin material because it can be formed thick. For example, the spacer 236 can be formed using a positive or negative photosensitive resin. When a light-blocking material is used for the spacer 236, the spacer 236 blocks light emitted from a light-emitting element 220 in an adjacent pixel, thereby preventing color mixture between the adjacent pixels.

Note that there is no particular limitation on the structures of the transistors included in the pixel portion 211, the source driver circuit 212, and the gate driver circuit 213. For example, a forward staggered transistor or an inverted staggered transistor may be used. Further, a top-gate transistor or a bottom-gate transistor may be used. As a semiconductor material used for the transistors, for example, a semiconductor material such as silicon or germanium or an oxide semiconductor containing at least one of indium, gallium, and zinc may be used.

Further, there is no particular limitation on the crystallinity of a semiconductor used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of transistor characteristics can be reduced.

Typical examples of the oxide semiconductor containing at least one of indium, gallium, and zinc include an In—Ga—Zn—O-based metal oxide. An oxide semiconductor having a wider band gap and a lower carrier density than silicon is preferably used because off-state leakage current can be reduced. Details of preferred oxide semiconductors will be described below in another embodiment.

The light-emitting element 220 includes the first electrode layer 221, a second electrode layer 223, and an EL layer 222 provided therebetween. The light-emitting element 220 will be described below.

In the light-emitting element 220, a light-transmitting material that transmits light emitted from the EL layer 222 is used for an electrode layer provided on the light exit side.

As the light-transmitting material, a conductive oxide such as indium oxide, indium tin oxide, indium zinc oxide, zinc oxide, or zinc oxide to which gallium is added can be used. Alternatively, graphene may be used. Other examples include a metal material such as gold, silver, platinum, magnesium, nickel, tungsten, chromium, molybdenum, iron, cobalt, copper, palladium, or titanium and an alloy material containing any of these metal materials. Alternatively, a nitride of the metal material (e.g., titanium nitride) or the like may be used. In the case of using the metal material or the alloy material (or the nitride thereof), the thickness is set small enough to be able to transmit light. Alternatively, a stack of films of any of the above materials can be used as a conductive layer. For example, a stack of films of a silver-magnesium alloy and indium tin oxide is preferably used because conductivity can be increased.

Such an electrode layer is formed by an evaporation method, a sputtering method, or the like. Alternatively, a discharging method such as an ink-jet method, a printing method such as a screen printing method, or a plating method may be used.

Note that when a film of the above light-transmitting conductive oxide is formed by a sputtering method, the use of a deposition atmosphere containing argon and oxygen allows the conductive oxide to be capable of transmitting more light.

Further, in the case where a film of the conductive oxide is formed over the EL layer 222, it is preferable to stack a first conductive oxide film formed under an atmosphere containing argon with reduced oxygen concentration and a second conductive oxide film formed under an atmosphere containing argon and oxygen, in which case damage to the EL layer 222 due to film formation can be reduced. In this case, in the formation of the first conductive oxide film, it is preferable to use an argon gas with high purity, for example, an argon gas whose dew point is lower than or equal to −70° C., more preferably lower than or equal to −100° C.

For an electrode layer provided on a side opposite to the light exit side, a reflective material which reflects the light emission is used.

As a light reflective material, a metal material such as aluminum, gold, platinum, silver, nickel, tungsten, chromium, molybdenum, iron, cobalt, copper, or palladium or an alloy material containing any of these metal materials can be used. Alternatively, lanthanum, neodymium, germanium, or the like may be added to such a metal material or alloy material. Examples of alloy materials include alloys containing aluminum (aluminum alloys) such as an alloy of aluminum and titanium, an alloy of aluminum and nickel, and an alloy of aluminum and neodymium, alloys containing silver such as an alloy of silver and copper, an alloy of silver, palladium, and copper, and an alloy of silver and magnesium, and the like. An alloy of silver and copper is preferable because of its high heat resistance. Further, by stacking a metal film or a metal oxide film in contact with a film containing aluminum, oxidation of the film containing aluminum can be suppressed. Examples of the metal material or the metal oxide material in contact with the film containing aluminum include titanium, titanium oxide, and the like. Alternatively, a stack of a film containing any of the above light-transmitting materials and a film containing any of the above metal materials may be used. For example, a layered film of silver and indium tin oxide, a layered film of a silver-magnesium alloy and indium tin oxide, or the like can be used.

Such an electrode layer is formed by an evaporation method, a sputtering method, or the like. Alternatively, a discharging method such as an ink-jet method, a printing method such as a screen printing method, or a plating method may be used.

The EL layer 222 includes at least a layer containing a light-emitting organic compound (hereinafter also referred to as a light-emitting layer), and may be either a single layer or a stack of plural layers. One example of the structure in which a plurality of layers is stacked is a structure in which a hole-injection layer, a hole-transport layer, a light-emitting layer, an electron-transport layer, and an electron-injection layer are stacked in this order from an anode side. Note that not all of these layers except the light-emitting layer are necessarily provided in the EL layer 222. Further, each of these layers may be provided in duplicate or more. Specifically, in the EL layer 222, a plurality of light-emitting layers may be stacked, or another hole-injection layer may be stacked over the electron-injection layer. Furthermore, another component such as an electron-relay layer may be provided as appropriate as an intermediate layer, in addition to a charge-generation layer. Alternatively, a plurality of light-emitting layers exhibiting different colors may be stacked. For example, a white emission can be obtained by stacking two or more light-emitting layers of complementary colors.

The EL layer 222 can be formed by a vacuum evaporation method, a discharging method such as an ink-jet method or a dispensing method, a coating method such as a spin-coating method, a printing method, or the like.

In this embodiment, a reflective material is used for the first electrode layer 221, and a light-transmitting material is used for the second electrode layer 223. Thus, the light-emitting element 220 is a top-emission light-emitting element, and emits light to the second substrate 111 side.

The above is the description of the light-emitting element 220.

The first substrate 101 is provided with an insulating layer 237 in contact with an upper surface of the first substrate 101, an insulating layer 238 functioning as a gate insulating layer of transistors, and insulating layers 239 and 241 covering the transistors.

The insulating layer 237 is provided in order to prevent diffusion of impurities included in the first substrate 101. The insulating layers 238 and 239, which are in contact with semiconductor layers of the transistors, are preferably formed using a material which prevents diffusion of impurities that promote degradation of the transistors. For these insulating layers, for example, an oxide, a nitride, or an oxynitride of a semiconductor such as silicon or a metal such as aluminum can be used. Alternatively, a stack of such inorganic insulating materials or a stack of such an inorganic insulating material and an organic insulating material may be used. Note that the insulating layers 237 and 239 are not necessarily provided when not needed.

The insulating layer 241 functions as a planarization layer which covers steps due to the transistors, a wiring, or the like provided therebelow. For the insulating layer 241, it is preferable to use an organic resin material such as polyimide or acrylic. An inorganic insulating material may be used as long as high planarity can be obtained.

Here, a layer including the transistors and the light-emitting element 220 corresponds to the element layer 103. In this configuration example, a stack of components from an upper surface of the insulating layer 237 to the second electrode layer 223 corresponds to the element layer 103.

The second substrate 111 is provided with the first sensor electrode 114, the insulating layer 116, and the second sensor electrode 115 on a side facing the light-emitting element 220, and a stack of these layers corresponds to the sensor layer 113 in Embodiment 1.

A light-transmitting material which transmits light emitted from the light-emitting element 220 is used for the first sensor electrode 114 and the second sensor electrode 115. For example, any of the above-described light-transmitting conductive materials which can be used in the light-emitting element 220 can be used.

The insulating layer 116 insulates the first sensor electrode 114 and the second sensor electrode 115 from each other. A light-transmitting material which transmits light emitted from the light-emitting element 220 is used for the insulating layer 116. For example, an inorganic insulating material, an organic insulating material, or a stack of these materials can be used.

As illustrated in FIGS. 5A and 5B and FIG. 6, the first sensor electrode 114 and the second sensor electrode 115 may be provided not only in a region overlapping with the pixel portion 211 but also in a region overlapping with the source driver circuit 212 or the gate driver circuit 213.

An insulating layer 128 is provided so as to cover the first sensor electrode 114 and the second sensor electrode 115 at least in the region overlapping with the pixel portion 211. In addition, the insulating layer 128 is provided with the black matrix 242 and a color filter 243 on a side facing the light-emitting element 220.

The insulating layer 128 protects the second sensor electrode 115 and can insulate adjacent second sensor electrodes 115 from each other by filling a gap therebetween. For the insulating layer 128, it is preferable to use a material which provides high coverage in order to effectively cover a step due to the first sensor electrode 114 or the second sensor electrode 115. For example, a material similar to that of the insulating layer 241 is used. When the insulating layer 128 has a flat surface, the color filter 243 can have a uniform thickness, which enables the display device to have higher display quality.

The color filter 243 is provided in order to adjust the color of light emitted from the light-emitting element 220 to increase the color purity. For example, in a full-color display device using white light-emitting elements, a plurality of pixels provided with color filters of different colors is used. In that case, the color filters may be those of three colors of R (red), G (green), and B (blue) or four colors (yellow (Y) in addition to these three colors). Further, a white (W) pixel may be added to R, G, and B pixels (and a Y pixel). That is, color filters of four colors (or five colors) may be used.

Further, the black matrix 242 is provided between adjacent color filters 243. The black matrix 242 blocks light emitted from the light-emitting element 220 in an adjacent pixel, thereby preventing color mixture between the adjacent pixels. In one configuration, the black matrix 242 may be provided only between adjacent pixels of different emission colors and not between pixels of the same emission color. When the color filter 243 is provided so that its end portion overlaps with the black matrix 242, light leakage can be reduced. The black matrix 242 can be formed using a material that blocks light emitted from the light-emitting element 220, for example, a metal material, an organic resin material including a pigment, or the like. Note that it is preferable to provide the black matrix 242 also in a region overlapping with the gate driver circuit 213 or the like besides the pixel portion 211 as illustrated in FIG. 6, in which case undesired leakage of guided light or the like can be prevented.

In addition, an overcoat may be provided so as to cover the color filter 243 and the black matrix 242. The overcoat protects the color filter 243 and the black matrix 242 and suppresses the diffusion of impurities included in the color filter 243 and the black matrix 242. For the overcoat, a material which transmits light emitted from the light-emitting element 220 is used, and an inorganic insulating material or an organic insulating material can be used.

The first substrate 101 and the second substrate 111 are attached to each other with the adhesive layer 104. In this configuration example, a glass material is used for the first substrate 101 and the second substrate 111, and a glass material of low-melting-point glass is used for the adhesive layer 104. With the use of such materials, the entry of impurities, which may cause degradation of the light-emitting element 220 or the transistors, from the adhesive layer 104 can be effectively suppressed, which enables the display device to have extremely high reliability.

In particular, in the case where an oxide semiconductor is used as a semiconductor for the transistors, impurities such as hydrogen contained in an oxide semiconductor film as described below in another embodiment cause the threshold voltage of the transistors to be shifted in the negative direction, for example. Therefore, it is quite effective to seal a region provided with the transistors with the first substrate 101, the second substrate 111, and the adhesive layer 104 which are formed with a glass material, thereby suppressing the entry of impurity elements including hydrogen.

In the contact portion 203, the wiring 207 and an electrode 244 which is electrically connected to the wiring 207 are provided over the first substrate 101. The wiring 207 is formed by processing the same conductive film as the source electrode and the drain electrode of the transistor. The electrode 244 is formed by processing the same conductive film as the first electrode layer 221, and is electrically connected to the wiring 207 through an opening provided in the insulating layer 239 and the insulating layer 241. The wiring 207 and the electrode 244 provided in the contact portion 203 are preferably formed in the above manner by processing the conductive films used to form the transistors and the light-emitting element 220 because the contact portion 203 can be easily formed without increasing steps.

On the second substrate 111 side, the second sensor electrode 115 is provided so as to extend to the contact portion 203 and so as to have an exposed surface in the contact portion 203. Although not illustrated, the same applies to a contact portion for the first sensor electrode 114.

Furthermore, a resin layer 246 in which conductive particles 245 are dispersed is provided in the contact portion 203. By the contact of the conductive particles 245 in the resin layer 246 with both the second sensor electrode 115 and the electrode 244, the second sensor electrode 115 and the wiring 207 are electrically connected to each other.

As the conductive particles 245, particles of an organic resin, silica, or the like coated with a metal material are used. It is preferable to use nickel or gold as the metal material because contact resistance can be decreased. It is also preferable to use particles each coated with layers of two or more kinds of metal materials, such as particles coated with nickel and further with gold.

As a material of the resin layer 246 in which the conductive particles 245 can be dispersed, it is preferable to use a curable organic resin such as a heat curable organic resin or a photocurable organic resin.

It is preferable that the conductive particles 245 provided between the second sensor electrode 115 and the electrode 244 be deformed by being crushed under vertical pressure. By such deformation, the contact area between the conductive particles 245 and the second sensor electrode 115 or the electrode 244 is increased, whereby electrical connection can be secured. Note that, for convenience, the conductive particles 245 are illustrated in the schematic cross-sectional view in FIG. 6 as having an elliptical cross-sectional shape with a long axis in a direction perpendicular to the substrates. However, in many actual cases, the conductive particles 245 have a circular cross-sectional shape or an elliptical cross-sectional shape with a long axis component in a direction parallel to the substrates.

In the configuration illustrated in FIG. 6, the adhesive layer 104 is provided so as to surround at least the pixel portion 211 including the light-emitting element 220, and the contact portion 203 is provided outside the adhesive layer 104. In the case where a glass material is used for the adhesive layer 104, it is particularly preferable to provide the contact portion 203 outside the adhesive layer 104 as described above because it is possible to suppress diffusion of impurities such as water, which are contained in an organic resin or the like used in the contact portion 203, into a region inside the adhesive layer 104.

Further, as the layers which are provided so as to extend both in the region sealed with the adhesive layer 104 and in the region outside the sealed region as illustrated in FIG. 6, it is preferable not to use layers of a material such as an organic material which allows the passage of water or hydrogen. This makes it possible to effectively suppress the entry of water or hydrogen from the outside and to obtain a display device having high reliability.

Note that when a curable resin is used for the adhesive layer 104, the adhesive layer 104 may serve also as the resin layer 246. In that case, the adhesive layer 104 may be provided also in the contact portion 203, and the conductive particles 245 may be dispersed in part of the adhesive layer 104 in the contact portion 203. This eliminates the necessity of locating the contact portion 203 outside the adhesive layer 104 and therefore enables the display device to have a narrower frame. Note that it is preferable in that case to disperse a drying agent in the adhesive layer 104. For example, a substance which adsorbs moisture by chemical adsorption, such as an oxide of an alkaline earth metal (e.g., calcium oxide or barium oxide), can be used. Alternatively, a substance which adsorbs moisture by physical adsorption, such as zeolite or silica gel, may be used as the drying agent.

The wiring 206 is provided so as to extend to the outside of the region sealed with the adhesive layer 104 and is electrically connected to the gate driver circuit 213 (or the source driver circuit 212). Part of an end portion of the wiring 206 forms part of the external connection electrode 205. In this configuration example, the external connection electrode 205 is formed by a stack of a conductive film used for the source electrode and the drain electrode of the transistor and a conductive film used for the gate electrode of the transistor. The external connection electrode 205 is preferably formed by a stack of a plurality of conductive films as described above because mechanical strength against a pressure bonding step performed on the FPC 204 or the like can be increased.

A connection layer 208 is provided in contact with the external connection electrode 205. The FPC 204 is electrically connected to the external connection electrode 205 through the connection layer 208. For the connection layer 208, an anisotropic conductive film (ACF), anisotropic conductive paste (ACP), or the like can be used.

Although not illustrated here, the wiring 207 is provided so as to extend to an end portion of the first substrate 101, and part of an end portion of the wiring 207 forms part of the external connection electrode 205 and is electrically connected to the FPC 204.

The end portions of the wiring 206, the wiring 207, and the external connection electrode 205 are preferably covered with an insulating layer so that surfaces thereof are not exposed because oxidation of the surfaces and defects such as short-circuit can be suppressed. In that case, the insulating layer covering the wiring 206, the wiring 207, and the external connection electrode 205 are preferably formed by processing the same film as any of the insulating layers included in the pixel portion 211 because the insulating layer can be formed without increasing steps.

In FIG. 6, a reinforcing material 209 is provided between the FPC 204 and the adhesive layer 104 so as to be in contact with both the FPC 204 and the second substrate 111. In this configuration example, an extremely thin glass substrate is used as the first substrate 101; thus, a region between the FPC 204 and the adhesive layer 104 has a relatively low mechanical strength. Therefore, a crack might be caused in that region by mechanical force applied to the vicinity of the FPC 204 when the display device is incorporated into an electronic device, for example. The reinforcing material 209 provided as described above can increase the mechanical strength of the region between the FPC 204 and the adhesive layer 104, which enables the display device to have high reliability.

As the reinforcing material 209, an organic resin material is preferably used. For example, a curable organic resin such as a heat curable organic resin, a photocurable organic resin, or a two-component type curable organic resin can be used.

Note that the reinforcing material 209 may be provided also on the back side of the first substrate 101. When both sides of the first substrate 101 are reinforced by the reinforcing material 209, the mechanical strength can be further increased, and damage to an extremely thin display device can be reduced.

The above is the description of this cross-sectional configuration example. Such a configuration makes it possible to obtain a display device which is extremely thin and has high mechanical strength and high reliability.

Cross-Sectional Configuration Example 2

A cross-sectional configuration example of the display device 200 in which a liquid crystal element is included in the display portion 201 will be described below. Note that description of the portions already described above is omitted or is simplified.

Figure 7:
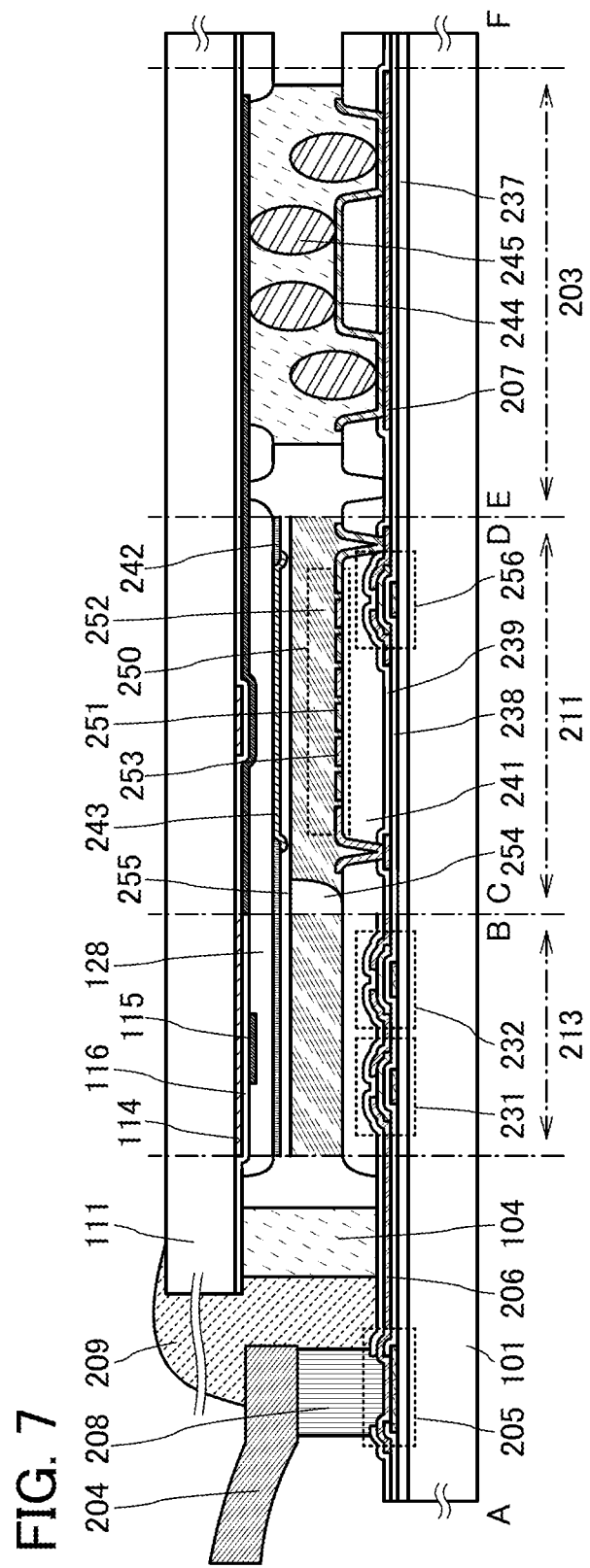
FIG. 7 illustrates a configuration example of a display device in one embodiment of the present invention.

FIG. 7 is a schematic cross-sectional view of the display device described in this configuration example. The display device in FIG. 7 differs from the configuration described above in Cross-sectional Configuration Example 1, mainly in the pixel portion 211 and the adhesive layer 104.

The pixel portion 211 includes a liquid crystal element 250 using in-plane switching (IPS) mode. In the liquid crystal element 250, the orientation of a liquid crystal is controlled by an electric field generated in a direction parallel to the substrate surface.

The pixel portion 211 includes at least one switching transistor 256 and a storage capacitor which is not illustrated. In addition, a first electrode layer 251 having a comb shape is provided over the insulating layer 241 so as to be electrically connected to a source electrode or a drain electrode of the transistor 256. Furthermore, a second electrode layer 253 having a comb shape is provided so as to be insulated from the first electrode layer 251 on the same plane.

For at least one of the first and second electrode layers 251 and 253, any of the above-described light-transmitting conductive materials is used. It is preferable to use a light-transmitting conductive material for both of these electrode layers because the aperture ratio of the pixel can be increased.

Although the first electrode layer 251 and the second electrode layer 253 are distinguished from each other in FIG. 7 by using different hatch patterns, these electrode layers are preferably formed by processing the same conductive film.

In the pixel portion 211, the second substrate 111 is provided with the color filter 243 and the black matrix 242 as in Cross-sectional Configuration Example 1. In FIG. 7, an overcoat 255 is provided so as to cover the color filter 243 and the black matrix 242. The overcoat 255 can suppress diffusion of impurities such as a pigment, which are included in the color filter 243 and the black matrix 242, into a liquid crystal 252.

In addition, a spacer 254 is provided in a region where the overcoat 255 overlaps with the black matrix 242. The spacer 254 can be formed using a material similar to that of the spacer 236 in Cross-sectional Configuration Example 1. Although the spacer 254 is provided on the second substrate 111 side in this configuration example, the spacer 254 may be provided on the first substrate 101 side.

The liquid crystal 252 is sealed at least in a region where the first electrode layer 251 and the second electrode layer 253 are provided. Here, the first electrode layer 251, the second electrode layer 253, and the liquid crystal 252 form the liquid crystal element 250.

An image can be displayed in the following way: an electric field is generated in the horizontal direction by application of voltage between the first electrode layer 251 and the second electrode layer 253, orientation of the liquid crystal 252 is controlled by the electric field, and polarization of light from a backlight provided outside the display device is controlled in each pixel.

An alignment film that controls orientation of the liquid crystal 252 may be provided on a surface in contact with the liquid crystal 252. A light-transmitting material is used for the alignment film. Although not illustrated here, polarizing plates are provided on outer sides of the first substrate 101 and the second substrate 111 with respect to the liquid crystal element 250. Moreover, a light guide plate may be used so that light from the backlight enters through a side surface of the display device.

In this configuration example, a color filter is provided in a region overlapping with the liquid crystal element 250; thus, a full-color image can be displayed using a backlight that emits white light. With the use of a plurality of light-emitting diodes (LEDs) which emit light of different colors as a backlight, a time-division display method (a field-sequential driving method) can be employed. In the case of employing a time-division display method, the aperture ratio of each pixel or the number of pixels per unit area can be increased because neither color filters nor subpixels from which light of red (R), green (G), or blue (B), for example, is obtained are needed.

As the liquid crystal 252, a thermotropic liquid crystal, a low molecular weight liquid crystal, a polymer liquid crystal, a ferroelectric liquid crystal, an anti-ferroelectric liquid crystal, or the like can be used. Moreover, a liquid crystal exhibiting a blue phase is preferably used because an alignment film is not necessary and the viewing angle is wide.

Although the liquid crystal element 250 using IPS mode is described in this configuration example, the mode of the liquid crystal element is not limited to this example, and a twisted nematic (TN) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

Here, the light-emitting element 250 preferably uses the IPS mode or the FFS mode. A liquid crystal element using such a mode does not require an electrode to be provided on the second substrate 111 side. Thus, it is possible to reduce the influence of parasitic capacitance generated between an electrode of the touch sensor provided on the second substrate 111 side and the electrode of the liquid crystal element, thereby improving the sensitivity of the touch sensor.

In this configuration example, the adhesive layer 104 serves also as the resin layer 246 used in the contact portion 203, as described as one example in Cross-sectional Configuration Example 1. For the adhesive layer 104, a curable organic resin is used, and the adhesive layer 104 is provided so as to overlap with the contact portion 203. In addition, the conductive particles 245 are dispersed in the region overlapping with the contact portion 203. This enables the display device to have a narrow frame.

As illustrated in FIG. 7, layers formed using an organic material, such as the insulating layer 241 and the insulating layer 128, are preferably processed into island shapes so that these layers do not continuously extend both in the region provided with the pixel portion 211 and the gate driver circuit 213 (and the source driver circuit 212) and in the region provided with the adhesive layer 104 and so that these layers have end portions between these regions. This makes it possible to suppress diffusion of impurities such as moisture into the liquid crystal element 250 or the transistor through the insulating layer 241, the insulating layer 128, or the like even when an organic resin is used for the adhesive layer 104.

The above is the description of this configuration example. Such a configuration makes it possible to obtain a display device which is extremely thin and has high mechanical strength and high reliability.

This embodiment can be implemented in an appropriate combination with any of the other embodiments described in this specification.

Embodiment 3

In this embodiment, a configuration example of a light-emitting element which can be applied to a light-emitting device in one embodiment of the present invention will be described with reference to drawings.

The light-emitting element shown as an example in this embodiment includes a first electrode layer, a second electrode layer, and a layer containing a light-emitting organic compound (hereinafter referred to as an EL layer) between the first electrode layer and the second electrode layer. One of the first and second electrode layers functions as an anode, and the other functions as a cathode. The EL layer is provided between the first electrode layer and the second electrode layer, and a structure of the EL layer may be appropriately determined in accordance with materials of the first electrode layer and the second electrode layer. Examples of the configuration of the light-emitting element are described below; it is needless to say that the configuration of the light-emitting element is not limited to these examples.

Configuration Example 1 of Light-Emitting Element

Figure 8A:
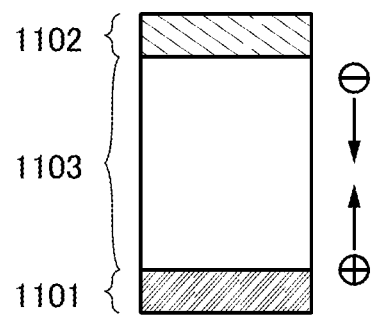
FIGS. 8A to 8E each illustrate a configuration example of a light-emitting element in one embodiment of the present invention.

An example of a configuration of the light-emitting element is illustrated in FIG. 8A. In the light-emitting element illustrated in FIG. 8A, an EL layer including a light-emitting unit 1103 is provided between an anode 1101 and a cathode 1102.

When a voltage higher than the threshold voltage of the light-emitting element is applied between the anode 1101 and the cathode 1102, holes are injected to the EL layer from the anode 1101 side and electrons are injected to the EL layer from the cathode 1102 side. The injected electrons and holes are recombined in the EL layer, so that a light-emitting substance contained in the EL layer emits light.

In this specification, a layer or a stacked body which includes one region where electrons and holes injected from both ends are recombined is referred to as a light-emitting unit. Therefore, the configuration example 1 of the light-emitting element includes one light-emitting unit.

The light-emitting unit 1103 includes at least one light-emitting layer containing a light-emitting substance, and may have a structure in which the light-emitting layer and a layer other than the light-emitting layer are stacked. Examples of the layer other than the light-emitting layer are layers containing a substance having a high hole-injection property, a substance having a high hole-transport property, a substance having a poor hole-transport property (substance which blocks holes), a substance having a high electron-transport property, a substance having a high electron-injection property, a substance having a bipolar property (substance having high electron- and hole-transport properties), and the like.

Figure 8B:
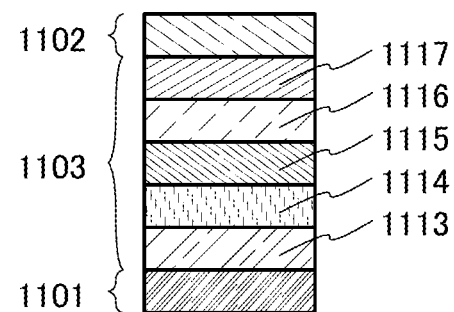

An example of a specific configuration of the light-emitting unit 1103 is illustrated in FIG. 8B. In the light-emitting unit 1103 illustrated in FIG. 8B, a hole-injection layer 1113, a hole-transport layer 1114, a light-emitting layer 1115, an electron-transport layer 1116, and an electron-injection layer 1117 are stacked in this order from the anode 1101 side.

Configuration Example 2 of Light-Emitting Element

Figure 8C:
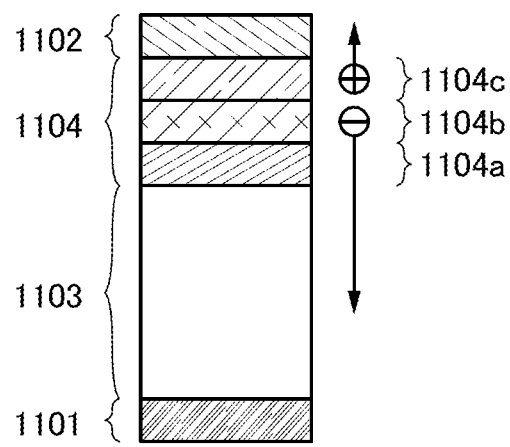

Another example of the configuration of the light-emitting element is illustrated in FIG. 8C. In the light-emitting element illustrated in FIG. 8C, the EL layer including the light-emitting unit 1103 is provided between the anode 1101 and the cathode 1102. Further, an intermediate layer 1104 is provided between the cathode 1102 and the light-emitting unit 1103. Note that a configuration similar to that of the light-emitting unit included in the configuration example 1 of the light-emitting element, which is described above, can be applied to the light-emitting unit 1103 in the configuration example 2 of the light-emitting element and that the description of the configuration example 1 of the light-emitting element can be referred to for the details.

The intermediate layer 1104 may be formed to include at least a charge-generation region, and may have a structure in which the charge-generation region and a layer other than the charge-generation region are stacked. For example, a structure can be employed in which a first charge-generation region 1104c, an electron-relay layer 1104b, and an electron-injection buffer 1104a are stacked in this order from the cathode 1102 side.

The behaviors of electrons and holes in the intermediate layer 1104 are described. When a voltage higher than the threshold voltage of the light-emitting element is applied between the anode 1101 and the cathode 1102, in the first charge-generation region 1104c, holes and electrons are generated, and the holes move into the cathode 1102 and the electrons move into the electron-relay layer 1104b. The electron-relay layer 1104b has a high electron-transport property and immediately transfers the electrons generated in the first charge-generation region 1104c to the electron-injection buffer 1104a. The electron-injection buffer 1104a can lower a barrier against electron injection into the light-emitting unit 1103, so that the efficiency of the electron injection into the light-emitting unit 1103 is increased. Thus, the electrons generated in the first charge-generation region 1104c are injected into the LUMO level of the light-emitting unit 1103 through the electron-relay layer 1104b and the electron-injection buffer 1104a.

In addition, the electron-relay layer 1104b can prevent interaction in which the substance included in the first charge-generation region 1104c and the substance included in the electron-injection buffer 1104a react with each other at the interface therebetween and the functions of the first charge-generation region 1104c and the electron-injection buffer 1104a are impaired.

The range of choices of materials that can be used for the cathode in the configuration example 2 of the light-emitting element is wider than that of materials that can be used for the cathode in the configuration example 1. This is because the cathode in the configuration example 2 should simply receive holes generated by the intermediate layer and a material having a relatively high work function can be used for the cathode.

Configuration Example 3 of Light-Emitting Element

Figure 8D:
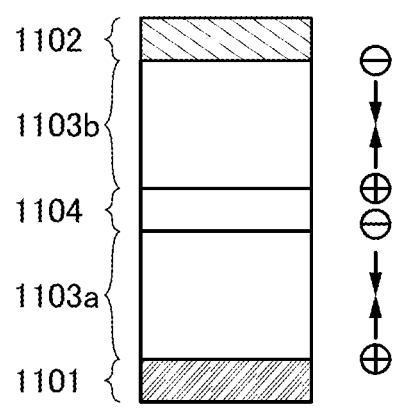

Another example of the configuration of the light-emitting element is illustrated in FIG. 8D. In the light-emitting element illustrated in FIG. 8D, an EL layer including two light-emitting units is provided between the anode 1101 and the cathode 1102. Furthermore, the intermediate layer 1104 is provided between a first light-emitting unit 1103a and a second light-emitting unit 1103b.

Figure 8E:
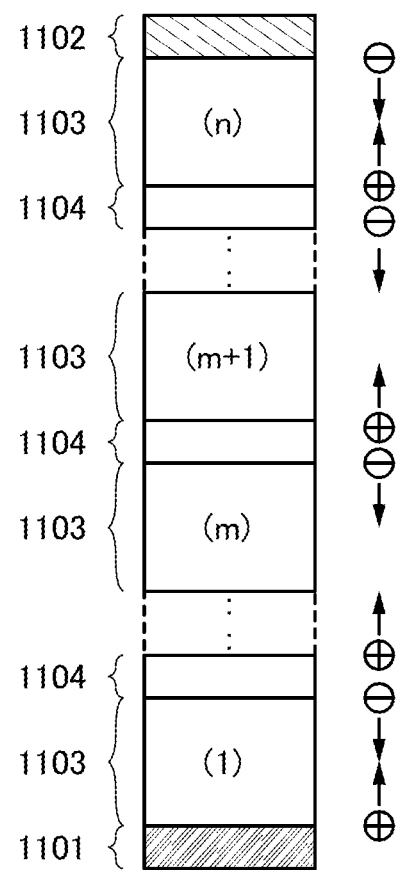

Note that the number of light-emitting units provided between the anode and the cathode is not limited to two. A light-emitting element illustrated in FIG. 8E has what is called a tandem structure, that is, a structure in which a plurality of light-emitting units 1103 is stacked. Note that in the case where n (n is a natural number greater than or equal to 2) light-emitting units 1103 are provided between the anode and the cathode, for example, the intermediate layer 1104 is provided between an m-th (m is a natural number greater than or equal to 1 and less than or equal to n−1) light-emitting unit and an (m+1)-th light-emitting unit.

Note that a configuration similar to that in the configuration example 1 of the light-emitting element can be applied to the light-emitting unit 1103 in the configuration example 3 of the light-emitting element; a configuration similar to that in the configuration example 2 of the light-emitting element can be applied to the intermediate layer 1104 in the configuration example 3 of the light-emitting element. Thus, for the details, the description of the configuration example 1 of the light-emitting element or the configuration example 2 of the light-emitting element can be referred to.

The behaviors of electrons and holes in the intermediate layer 1104 provided between the light-emitting units are described. When a voltage higher than the threshold voltage of the light-emitting element is applied between the anode 1101 and the cathode 1102, holes and electrons are generated in the intermediate layer 1104, and the holes move into the light-emitting unit provided on the cathode 1102 side and the electrons move into the light-emitting unit provided on the anode 1101 side. The holes injected into the light-emitting unit provided on the cathode side are recombined with electrons injected from the cathode side, so that a light-emitting substance contained in the light-emitting unit emits light. The electrons injected into the light-emitting unit provided on the anode side are recombined with holes injected from the anode side, so that a light-emitting substance contained in the light-emitting unit emits light. Thus, the holes and electrons generated in the intermediate layer 1104 cause light emission in different light-emitting units.

Note that the light-emitting units can be provided in contact with each other when these light-emitting units allow the same structure as the intermediate layer to be formed therebetween. Specifically, when one surface of the light-emitting unit is provided with a charge-generation region, the charge-generation region functions as a first charge-generation region of the intermediate layer; thus, the light-emitting units can be provided in contact with each other.

The configuration examples 1 to 3 of the light-emitting element can be implemented in combination. For example, an intermediate layer may be provided between the cathode and the light-emitting unit in the configuration example 3 of the light-emitting element.

Further, a plurality of light-emitting substances which emit light of different colors can be used, whereby, for example, white light emission can also be obtained by expanding the width of the emission spectrum. In order to obtain white light emission, for example, a configuration may be employed in which at least two layers containing light-emitting substances are provided so that light of complementary colors is emitted. Specific examples of complementary colors include "blue and yellow", "blue-green and red", and the like.

Further, in order to obtain white light emission with an excellent color rendering property, an emission spectrum preferably spreads through the entire visible light region. For example, a light-emitting element may include layers emitting light of blue, green, and red.

This embodiment can be implemented in an appropriate combination with any of the other embodiments described in this specification.

Embodiment 4

An example of a semiconductor which is preferably used for the region where a channel is formed in the transistor which is shown as an example in the above embodiment is described below.

An oxide semiconductor has a wide energy gap of 3.0 eV or more. A transistor including an oxide semiconductor film obtained by processing of the oxide semiconductor in an appropriate condition and a sufficient reduction in carrier density of the oxide semiconductor can have much lower leakage current between a source and a drain in an off state (off-state current) than a conventional transistor including silicon.

An oxide semiconductor containing at least indium (In) or zinc (Zn) is preferably used. In particular, In and Zn are preferably contained. In addition, as a stabilizer for reducing variation in electrical characteristics of a transistor using the oxide semiconductor, one or more elements selected from gallium (Ga), tin (Sn), hafnium (Hf), zirconium (Zr), titanium (Ti), scandium (Sc), yttrium (Y), and a lanthanoid (such as cerium (Ce), neodymium (Nd), or gadolinium (Gd)) is preferably contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Here, an "In—Ga—Zn-based oxide" means an oxide containing In, Ga, and Zn as main components and there is no limitation on the ratio of In:Ga:Zn. Further, a metal element in addition to In, Ga, and Zn may be contained.

Alternatively, a material represented by $InMO_3(ZnO)_m$ (m>0, where m is not an integer) may be used as the oxide semiconductor. Note that M represents one or more metal elements selected from Ga, Fe, Mn, and Co, or the above-described element as a stabilizer. Alternatively, a material represented by $In_2SnO_5(ZnO)_n$ (n>0, where n is an integer) may be used as the oxide semiconductor.

For example, an In—Ga—Zn-based oxide with an atomic ratio of In:Ga:Zn=1:1:1, In:Ga:Zn=3:1:2, or In:Ga:Zn=2:1:3, or an oxide with an atomic ratio close to the above atomic ratios can be used.

The oxide semiconductor film may be either single crystal or non-single-crystal. In the latter case, the oxide semiconductor film may be either amorphous or polycrystalline. Further, the oxide semiconductor film may have either an amorphous structure including a crystalline portion or a non-amorphous structure.

The oxide semiconductor film is preferably a CAAC-OS (c-axis aligned crystalline oxide semiconductor) film.

The CAAC-OS film is described below.

In most cases, a crystal part of the CAAC-OS film fits inside a cube whose one side is less than 100 nm. From an observation image obtained with a transmission electron microscope (TEM), a boundary between a crystal part and a crystal part in the CAAC-OS film is not clear. Further, with the TEM, a grain boundary in the CAAC-OS film is not found. Thus, in the CAAC-OS film, a reduction in electron mobility due to the grain boundary is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°. In addition, a term "parallel" includes a range from −10° to 10°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, crystallinity of the crystal part in a region to which the impurity is added is lowered in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of the c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

There are three methods for forming a CAAC-OS film when the CAAC-OS film is used as the oxide semiconductor film.

The first method is to form an oxide semiconductor film at a temperature higher than or equal to 100° C. and lower than or equal to 450° C., whereby crystal parts in which the c-axes are aligned in the direction parallel to a normal vector of a surface where the oxide semiconductor film is formed or a normal vector of a surface of the oxide semiconductor film are formed in the oxide semiconductor film.

The second method is to form an oxide semiconductor film with a small thickness and then heat it at a temperature higher than or equal to 200° C. and lower than or equal to 700° C., to form, in the oxide semiconductor film, crystal parts in which the c-axes are aligned in the direction parallel to a normal vector of a surface where the oxide semiconductor film is formed or a normal vector of a surface of the oxide semiconductor film.

The third method is to form a first oxide semiconductor film with a small thickness, then heat it at a temperature higher than or equal to 200° C. and lower than or equal to 700° C., and form a second oxide semiconductor film, whereby crystal parts in which the c-axes are aligned in the direction parallel to a normal vector of a surface where the oxide semiconductor film is formed or a normal vector of a surface of the oxide semiconductor film are formed in the oxide semiconductor film.

In a transistor using the CAAC-OS film, change in electrical characteristics due to irradiation with visible light or ultraviolet light is small. Thus, the transistor has high reliability.

The CAAC-OS film is preferably formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to the a-b plane (flat-plate-like sputtered particle or pellet-like sputtered particle) may flake off from the sputtering target. In that case, the flat-plate-like or pellet-like sputtered particle reaches a surface where the CAAC-OS film is formed while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the heating temperature of the surface where the CAAC-OS film is formed (for example, the substrate heating temperature) during the deposition, migration of a sputtered particle is likely to occur after the sputtered particle reaches the surface where the CAAC-OS film is formed. Specifically, the temperature of the surface where the CAAC-OS film is formed during the deposition is higher than or equal to 100° C. and lower than or equal to 740° C., preferably higher than or equal to 200° C. and lower than or equal to 500° C. By increasing the temperature of the surface where the CAAC-OS film is formed during the deposition, when the flat-plate-like or pellet-like sputtered particle reaches the surface where the CAAC-OS film is formed, migration occurs on the surface where the CAAC-OS film is formed, so that a flat plane of the sputtered particle is attached to the surface where the CAAC-OS film is formed.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing InOx powder, GaOy powder, and ZnOz powder in a predetermined molar ratio, applying pressure, and performing heat treatment at a temperature higher than or equal to 1000° C. and lower than or equal to 1500° C. Note that X, Y and Z are given positive numbers. Here, the predetermined molar ratio of InOx powder to GaOy powder and ZnOz powder is, for example, 1:1:1, 1:1:2, 1:3:2, 2:1:3, 2:2:1, 3:1:1, 3:1:2, 3:1:4, 4:2:3, 8:4:3, or a ratio close to these ratios. The kinds of powder and the molar ratio for mixing powder may be determined as appropriate depending on the desired sputtering target.

The above is the description of the CAAC-OS film.

Further, when the oxide semiconductor film contains a large amount of hydrogen, the hydrogen and an oxide semiconductor are bonded to each other, so that part of the hydrogen serves as a donor and causes generation of an electron which is a carrier. As a result, the threshold voltage of the transistor shifts in the negative direction. Accordingly, the concentration of hydrogen in the oxide semiconductor film is preferably lower than $5\times10^{18}$ atoms/cm$^3$, more preferably lower than or equal to $1\times10^{18}$ atoms/cm$^3$, still more preferably lower than or equal to $5\times10^{17}$ atoms/cm$^3$, further more preferably lower than or equal to $1\times10^{16}$ atoms/cm$^3$. Note that the concentration of hydrogen in the oxide semiconductor film is measured by secondary ion mass spectrometry (SIMS).

After formation of the oxide semiconductor film, it is preferable that dehydration treatment (dehydrogenation treatment) be performed to remove hydrogen or moisture from the oxide semiconductor film so that the oxide semiconductor film is highly purified to contain impurities as little as possible, and that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, or treatment for making the oxygen content of an oxide semiconductor film be in excess of that of the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) or substantially i-type oxide semiconductor film. The oxide semiconductor film formed in such a manner includes extremely few (close to zero) carriers derived from a donor, and the carrier concentration thereof is lower than $1\times10^{14}$/cm$^3$, preferably lower than $1\times10^{12}$/cm$^3$, further preferably lower than $1\times10^{11}$/cm$^3$, still further preferably lower than $1.45\times10^{10}$/cm$^3$.

The transistor including the oxide semiconductor film which is highly purified by sufficiently reducing the hydrogen concentration, and in which defect levels in the energy gap due to oxygen vacancies are reduced by sufficiently supplying oxygen can achieve excellent off-state current characteristics. For example, the off-state current per micrometer in the channel width with a channel length of 1 µm at room temperature (25° C.) is less than or equal to 100 yA (1 yA (yoctoampere) is $1\times10^{-24}$ A), desirably less than or equal to 10 yA. In addition, the off-state current per micrometer in the channel width at 85° C. is less than or equal to 100 zA (1 zA (zeptoampere) is $1\times10^{-21}$ A), desirably less than or equal to 10 zA. In this manner, the transistor which has extremely favorable off-state current characteristics can be obtained with the use of an i-type (intrinsic) or substantially i-type oxide semiconductor film.

The oxide semiconductor film may have a structure in which a plurality of oxide semiconductor films is stacked.

For example, the oxide semiconductor film may be a stack of a first oxide semiconductor film, a second oxide semiconductor film, and a third oxide semiconductor film which have different compositions. For example, the following structure can be employed: the first oxide semiconductor film and the third oxide semiconductor film are formed using a three-component metal oxide and the second oxide semiconductor film is formed using a two-component metal oxide; or the first oxide semiconductor film and the third oxide semiconductor film are formed using a two-component metal oxide and the second oxide semiconductor film is formed using a three-component metal oxide.

Further, the constituent elements of the first oxide semiconductor film, the second oxide semiconductor film, and the third oxide semiconductor film may be the same and the proportions of the constituent elements of the first oxide semiconductor film, the second oxide semiconductor film, and the third oxide semiconductor film may be different. For example, the first oxide semiconductor film and the third oxide semiconductor film may each have an atomic ratio of In:Ga:Zn=1:1:1, and the second oxide semiconductor film may have an atomic ratio of In:Ga:Zn=3:1:2. Alternatively, the first oxide semiconductor film and the third oxide semiconductor film may each have an atomic ratio of In:Ga:Zn=1:3:2, and the second oxide semiconductor film may have an atomic ratio of In:Ga:Zn=3:1:2.

At this time, the second oxide semiconductor film preferably contains more In than Ga (In>Ga). Further, the first oxide semiconductor film and the third oxide semiconductor film preferably contain In and Ga at a proportion of In≤Ga.

In an oxide semiconductor, the s orbital of heavy metal mainly contributes to carrier conduction, and when the In content in the oxide semiconductor is increased, overlaps of the s orbitals are likely to be increased. Therefore, an oxide having a composition of In>Ga has higher mobility than an oxide having a composition of In≤Ga. Further, in Ga, the formation energy of an oxygen vacancy is larger and thus oxygen vacancies are less likely to be generated, than in In; therefore, the oxide having a composition of In≤Ga has more stable characteristics than the oxide having a composition of In>Ga.

Note that when the film (such as a gate insulating film) which is in contact with and is different from the oxide semiconductor film is formed, an impurity might be diffused into the oxide semiconductor film from the film formed to be in contact with the oxide semiconductor film. When silicon, carbon, or the like is diffused into the oxide semiconductor film, electrical characteristics of the transistor may be adversely affected.

However, the adverse effect on the electrical characteristics of the transistor (e.g., a reduction in mobility) which is attributed to impurity diffusion can be reduced when a stacked-layer structure of the oxide semiconductor films is provided as described above and the oxide semiconductor film (i.e., the oxide semiconductor film having a composition of In≤Ga, corresponding to the first oxide semiconductor film and the third oxide semiconductor film described above) which has fewer oxygen vacancies and more stable characteristics than the oxide semiconductor film that has high mobility (i.e., the oxide semiconductor film having a composition of In>Ga, corresponding to the second oxide semiconductor film described above) is provided in contact with the oxide semiconductor film that has high mobility, whereby the oxide semiconductor film that has high mobility is not in contact with a film which is in contact with the oxide semiconductor film. In this manner, the mobility and reliability of the transistor can be improved.

This embodiment can be implemented in an appropriate combination with any of the other embodiments described in this specification.

Embodiment 5

In this embodiment, examples of electronic devices each including a display device with a touch sensor in one embodiment of the present invention will be described with reference to FIGS. 9A to 9D.

Figure 9A:
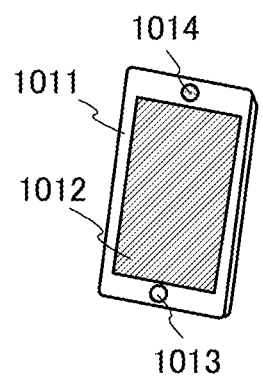
FIGS. 9A to 9D each illustrate an example of an electronic device including a display device in one embodiment of the present invention.

An electronic device illustrated in FIG. 9A is an example of a portable information terminal.

The electronic device illustrated in FIG. 9A has a housing 1011 which is provided with a panel 1012, a button 1013, and a speaker 1014.

Note that the housing 1011 may be provided with a connection terminal for connecting the electronic device to an external device and a button for operating the electronic device.

The button 1013 is provided on the housing 1011. When the button 1013 is a power button, for example, the electronic device can be turned on or off by pressing the button 1013.

The speaker 1014 is provided on the housing 1011. The speaker 1014 outputs sound.

Note that the housing 1011 may be provided with a microphone, in which case the electronic device in FIG. 9A can function as a telephone, for example.

The electronic device illustrated in FIG. 9A functions as at least one of a telephone, an e-book reader, a personal computer, and a game machine, for example.

In the panel 1012, the display device with a touch sensor in one embodiment of the present invention can be used.

Figure 9B:
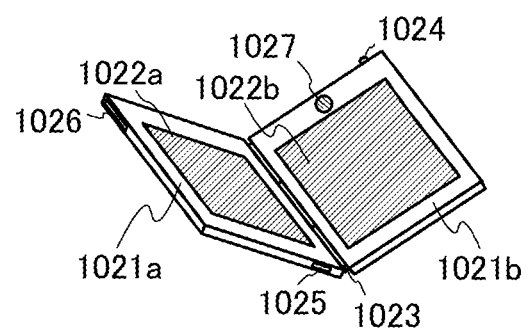

An electronic device illustrated in FIG. 9B is an example of a foldable information terminal.

The electronic device illustrated in FIG. 9B has a housing 1021a provided with a panel 1022a, a housing 1021b provided with a panel 1022b, a hinge 1023, a button 1024, a connection terminal 1025, a recording media inserting portion 1026, and a speaker 1027.

The housing 1021a and the housing 1021b are connected by the hinge 1023.

Since the electronic device in FIG. 9B includes the hinge 1023, it can be folded so that the panels 1022a and 1022b face each other.

The button 1024 is provided on the housing 1021b. Note that the button 1024 may be provided on the housing 1021a. For example, when the button 1024 having a function as a power button is provided, supply of power supply voltage to the electronic device can be controlled by pressing the button 1024.

The connection terminal 1025 is provided on the housing 1021a. Note that the connection terminal 1025 may be provided on the housing 1021*b*. Alternatively, a plurality of connection terminals 1025 may be provided on one or both of the housings 1021*a* and 1021*b*. The connection terminal 1025 is a terminal for connecting the electronic device illustrated in FIG. 9B to another device.

The recording media inserting portion 1026 is provided on the housing 1021*a*. The recording media inserting portion 1026 may be provided on the housing 1021*b*. Alternatively, a plurality of recording media inserting portions 1026 may be provided on one or both of the housings 1021*a* and 1021*b*. For example, a card-type recording medium is inserted into the recording media inserting portion so that data can be read to the electronic device from the card-type recording medium or data stored in the electronic device can be written to the card-type recording medium.

The speaker 1027 is provided on the housing 1021*b*. The speaker 1027 outputs sound. Note that the speaker 1027 may be provided on the housing 1021*a*.

Note that the housing 1021*a* or the housing 1021*b* may be provided with a microphone, in which case the electronic device in FIG. 9B can function as a telephone, for example.

The electronic device illustrated in FIG. 9B functions as at least one of a telephone, an e-book reader, a personal computer, and a game machine, for example.

In the panels 1022*a* and the panel 1022*b*, the display device with a touch sensor in one embodiment of the present invention can be used.

Figure 9C:
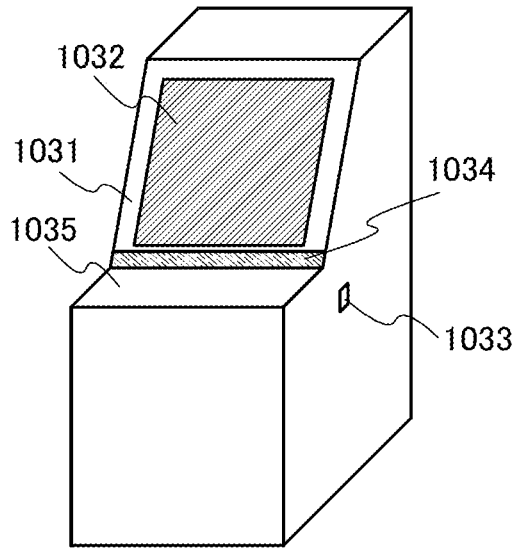

An electronic device illustrated in FIG. 9C is an example of a stationary information terminal. The electronic device illustrated in FIG. 9C has a housing 1031 which is provided with a panel 1032, a button 1033, and a speaker 1034.

Note that a panel similar to the panel 1032 may be provided on a top board 1035 of the housing 1031.

Further, the housing 1031 may be provided with a ticket slot for issuing a ticket or the like, a coin slot, a bill slot, and/or the like.

The button 1033 is provided on the housing 1031. For example, when the button 1033 is a power button, supply of a power voltage to the electronic device can be controlled by pressing the button 1033.

The speaker 1034 is provided on the housing 1031. The speaker 1034 outputs sound.

The electronic device in FIG. 9C serves as an automated teller machine, an information communication terminal (also referred to as multimedia station) for ordering a ticket or the like, or a game machine, for example.

In the panel 1032, the display device with a touch sensor in one embodiment of the present invention can be used.

Figure 9D:
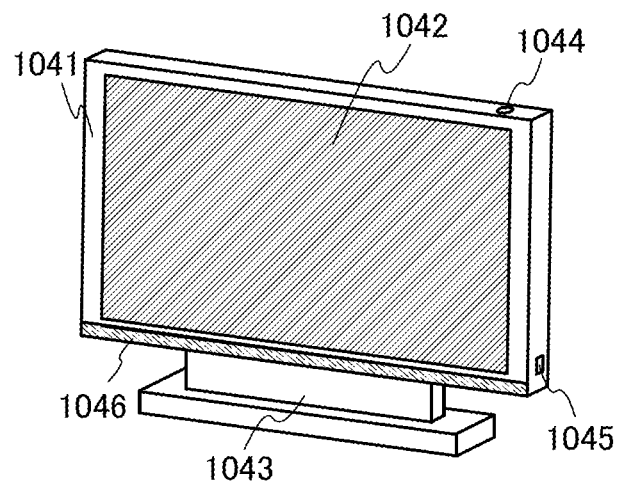

FIG. 9D illustrates an example of a stationary information terminal. The electronic device in FIG. 9D has a housing 1041 provided with a panel 1042, a support 1043 for supporting the housing 1041, a button 1044, a connection terminal 1045, and a speaker 1046.

Note that besides the connection terminal 1045, the housing 1041 may be provided with another connection terminal for connecting the electronic device to an external device.

The button 1044 is provided on the housing 1041. For example, when the button 1044 is a power button, supply of a power voltage to the electronic device can be controlled by pressing the button 1044.

The connection terminal 1045 is provided on the housing 1041. The connection terminal 1045 is a terminal for connecting the electronic device in FIG. 9D to another device. For example, when the electronic device in FIG. 9D and a personal computer are connected with the connection terminal 1045, the panel 1042 can display an image corresponding to a data signal input from the personal computer. For example, when the panel 1042 of the electronic device in FIG. 9D is larger than a panel of another electronic device connected thereto, a displayed image of the other electronic device can be enlarged, so that a plurality of viewers can easily see the image at the same time.

The speaker 1046 is provided on the housing 1041. The speaker 1046 outputs sound.

The electronic device in FIG. 9D functions as at least one of an output monitor, a personal computer, and a television set, for example.

In the panel 1042, the display device with a touch sensor in one embodiment of the present invention can be used.

The above is the description of the electronic devices illustrated in FIGS. 9A to 9D.

As described with reference to FIGS. 9A to 9D, the display device with a touch sensor in one embodiment of the present invention is used in the panel of each electronic device in this embodiment. Thus, the weight, size, and thickness of the electronic device can be decreased.

The display device in one embodiment of the present invention can also have flexibility because of its very small total thickness. Accordingly, the electronic device can also include a panel having a curved surface or a panel which can be curved.

This embodiment can be implemented in an appropriate combination with any of the other embodiments described in this specification.

This application is based on Japanese Patent Application serial no. 2012-156357 filed with Japan Patent Office on Jul. 12, 2012, the entire contents of which are hereby incorporated by reference.

What is claimed is:

1. A display device comprising:
   a light-emitting layer;
   a sensor layer over the light-emitting layer without a glass substrate provided therebetween;
   a first layer comprising a glass material over the sensor layer; and
   a second layer comprising a glass material or an organic resin material,
   wherein a thickness of the first layer comprising the glass material is greater than or equal to 10 µm and less than or equal to 200 µm,
   wherein a thickness of the second layer comprising the glass material or the organic resin material is greater than or equal to 10 µm and less than or equal to 200 µm,
   wherein the sensor layer is provided closer to a display surface side than the light-emitting layer, and
   wherein the first layer comprising the glass material is provided closer to the display surface side than the sensor layer.

2. A display device comprising:
   a light-emitting layer;
   a sensor layer over the light-emitting layer;
   a first layer comprising a glass material over the sensor layer; and
   a second layer comprising a glass material or an organic resin material,
   wherein a thickness of the first layer comprising the glass material is greater than or equal to 10 µm and less than or equal to 200 µm,
   wherein a thickness of the second layer comprising the glass material or the organic resin material is greater than or equal to 10 µm and less than or equal to 200 µm,
   wherein a display portion comprising the light-emitting layer has flexibility, wherein the sensor layer is provided closer to a display surface side than the light-emitting layer, and wherein the first layer comprising the glass material is provided closer to the display surface side than the sensor layer.

3. A display device comprising:
a light-emitting layer;
a sensor layer over the light-emitting layer;
a first layer comprising a glass material or an organic resin material over the sensor layer; and
a second layer comprising a glass material or an organic resin material,
wherein a thickness of the first layer comprising the glass material or the organic resin material is greater than or equal to 10 μm and less than or equal to 200 μm,
wherein a thickness of the second layer comprising the glass material or the organic resin material is greater than or equal to 10 μm and less than or equal to 200 μm,
wherein the sensor layer is provided closer to a display surface side than the light-emitting layer,
wherein the first layer comprising the glass material or the organic resin material is provided closer to the display surface side than the sensor layer, and
wherein the display device has flexibility.

4. The display device according to claim 1,
wherein the first layer comprising the glass material is a first substrate, and
wherein the second layer comprising the glass material or the organic resin material is a second substrate provided below the light-emitting layer.

5. The display device according to claim 2,
wherein the first layer comprising the glass material is a first substrate, and
wherein the second layer comprising the glass material or the organic resin material is a second substrate provided below the light-emitting layer.

6. The display device according to claim 3,
wherein the first layer comprising the glass material or the organic resin material is a first substrate, and
wherein the second layer comprising the glass material or the organic resin material is a second substrate provided below the light-emitting layer.

7. The display device according to claim 1, further comprising a light-emitting element, the light-emitting element comprising:
a first electrode;
the light-emitting layer over the first electrode; and
a second electrode over the light-emitting layer.

8. The display device according to claim 2, further comprising a light-emitting element, the light-emitting element comprising:
a first electrode;
the light-emitting layer over the first electrode; and
a second electrode over the light-emitting layer.

9. The display device according to claim 3, further comprising a light-emitting element, the light-emitting element comprising:
a first electrode;
the light-emitting layer over the first electrode; and
a second electrode over the light-emitting layer.

10. The display device according to claim 7, further comprising:
a first insulating layer over the first electrode and under the light-emitting layer;
a spacer over the first insulating layer and under the light-emitting layer;
a third layer over the second electrode, the third layer including an organic material;
a fourth layer over the third layer, the fourth layer including an inorganic insulating material;
a first sensor electrode of a touch sensor over the fourth layer; and
a second sensor electrode of the touch sensor over the first sensor electrode.

11. The display device according to claim 8, further comprising:
a first insulating layer over the first electrode and under the light-emitting layer;
a spacer over the first insulating layer and under the light-emitting layer;
a third layer over the second electrode, the third layer including an organic material;
a fourth layer over the third layer, the fourth layer including an inorganic insulating material;
a first sensor electrode of a touch sensor over the fourth layer; and
a second sensor electrode of the touch sensor over the first sensor electrode.

12. The display device according to claim 9, further comprising:
a first insulating layer over the first electrode and under the light-emitting layer;
a spacer over the first insulating layer and under the light-emitting layer;
a third layer over the second electrode, the third layer including an organic material;
a fourth layer over the third layer, the fourth layer including an inorganic insulating material;
a first sensor electrode of a touch sensor over the fourth layer; and
a second sensor electrode of the touch sensor over the first sensor electrode.

13. The display device according to claim 10,
wherein the third layer includes a black matrix, and
wherein the fourth layer is an insulating layer.

14. The display device according to claim 11,
wherein the third layer includes a black matrix, and
wherein the fourth layer is an insulating layer.

15. The display device according to claim 12,
wherein the third layer includes a black matrix, and
wherein the fourth layer is an insulating layer.

16. The display device according to claim 2, wherein a substrate comprising a glass material is not provided between the sensor layer and the light-emitting layer.

17. The display device according to claim 1, wherein the second layer comprising the glass material or the organic resin material is provided below the first layer comprising the glass material.

18. The display device according to claim 2, wherein the second layer comprising the glass material or the organic resin material is provided below the first layer comprising the glass material.

19. The display device according to claim 3, wherein the second layer comprising the glass material or the organic resin material is provided below the first layer comprising the glass material or the organic resin material.

20. The display device according to claim 3, wherein the second layer comprising the glass material or the organic resin material is provided below the light-emitting layer.

* * * * *